(12) United States Patent
Menzel et al.

(10) Patent No.: US 12,416,654 B2
(45) Date of Patent: Sep. 16, 2025

(54) SYSTEMS AND METHODS TO ANALYZE WAVEFORMS FROM MULTIPLE DEVICES IN POWER SYSTEMS

(71) Applicant: SCHNEIDER ELECTRIC USA, INC., Boston, MA (US)

(72) Inventors: Johannes Menzel, Saint Hilaire du Trouvet (FR); Jon Andrew Bickel, Murfreesboro, TN (US)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 595 days.

(21) Appl. No.: 17/009,208

(22) Filed: Sep. 1, 2020

(65) Prior Publication Data

US 2020/0393501 A1    Dec. 17, 2020

Related U.S. Application Data

(63) Continuation-in-part of application No. 15/090,082, filed on Apr. 4, 2016, now Pat. No. 10,802,081.

(51) Int. Cl.
*G01R 23/16* (2006.01)
*G01R 22/06* (2006.01)

(52) U.S. Cl.
CPC .......... *G01R 23/16* (2013.01); *G01R 22/068* (2013.01)

(58) Field of Classification Search
CPC .............................. G01R 23/16; G01R 22/068
See application file for complete search history.

(56) References Cited

U.S. PATENT DOCUMENTS

| 5,224,054 A | 6/1993 | Wallis |
| 5,233,538 A | 8/1993 | Wallis |

(Continued)

FOREIGN PATENT DOCUMENTS

| CN | 103633639 A | 3/2014 |
| EP | 2980594 A1 | 2/2016 |

(Continued)

OTHER PUBLICATIONS

Extended European Search Report from corresponding European Application No. 21193071.4 dated Feb. 7, 2022.

(Continued)

*Primary Examiner* — Shelby A Turner
*Assistant Examiner* — Xiuqin Sun
(74) *Attorney, Agent, or Firm* — Lando & Anastasi, LLP

(57) ABSTRACT

A method for analyzing waveform capture data in a power system includes measuring electrical signals in the power system using a plurality of intelligent electronic devices (IEDs). At least one electrical event is detected in the power system based on the measured electrical signals. In response to detecting the at least one electrical event, waveform captures are generated on the IEDs. The waveform captures are analyzed on at least one controller coupled to the IEDs to identify at least one associated characteristic/trait from the waveform captures. The at least one associated characteristic/trait is classified based on at least one of the analysis and the at least one associated characteristic/trait, and at least one potential relevancy of at least one of the at least one associated characteristic/trait and the classification(s) to the power system is determined. Action may be taken based on the determined at least one potential relevancy.

27 Claims, 10 Drawing Sheets

(56) References Cited

U.S. PATENT DOCUMENTS

| | | | |
|---|---|---|---|
| 8,260,579 B2 * | 9/2012 | Bickel | H02J 13/00002 |
| | | | 702/188 |
| 10,324,132 B2 * | 6/2019 | Saarinen | G01R 31/3274 |
| 2009/0012728 A1 | 1/2009 | Spanier et al. | |
| 2009/0150686 A1 | 6/2009 | Muthu-Mannivannan et al. | |
| 2009/0187344 A1 | 7/2009 | Brancaccio et al. | |
| 2010/0324845 A1 | 12/2010 | Spanier et al. | |
| 2011/0004324 A1 | 1/2011 | Bickel et al. | |
| 2011/0213577 A1 | 9/2011 | Mousavi et al. | |
| 2012/0078555 A1 | 3/2012 | Banhegyesi et al. | |
| 2013/0096854 A1 * | 4/2013 | Schweitzer, III | G01R 31/085 |
| | | | 702/59 |
| 2013/0346419 A1 | 12/2013 | Hewitt et al. | |
| 2015/0160296 A1 | 6/2015 | Saarinen et al. | |
| 2015/0185258 A1 | 7/2015 | Song et al. | |
| 2015/0331035 A1 * | 11/2015 | Li | H02H 1/0092 |
| | | | 702/59 |

FOREIGN PATENT DOCUMENTS

| | | |
|---|---|---|
| EP | 3229031 A1 | 10/2017 |
| JP | 2009017637 A * | 1/2009 |
| WO | 20090134832 A2 | 11/2009 |
| WO | 20110156400 A1 | 12/2011 |
| WO | 2014084980 A1 | 6/2014 |
| WO | 2019195520 A1 | 10/2019 |
| WO | 2019195532 A1 | 10/2019 |

OTHER PUBLICATIONS

Extended European Search Report from corresponding European Application No. 17164374.5 dated Aug. 29, 2017.
Extended European Search Report from corresponding European Application No. 24174635.3 dated Nov. 29, 2024.

* cited by examiner

| Categories | Typical Duration | Types |
|---|---|---|
| Transients | Less than 1 Cycle | Impulsive or Oscillatory |
| Short Duration Variations | 1/2 cycles to 1 Minute | Sags, Swells, Interruptions |
| Long Duration Variations | Over 1 Minute | Under-voltages, Over-voltages, Sustained Interruptions |
| Voltage Imbalance | Steady State | |
| Waveform Distortions | Steady State | Harmonics, Notching |
| Voltage Fluctuation | Intermittent | |
| Frequency Variations | Less than 10 Seconds | |

FIG. 4

SYSTEMS AND METHODS TO ANALYZE WAVEFORMS FROM MULTIPLE DEVICES IN POWER SYSTEMS

CROSS REFERENCE TO RELATED APPLICATION

This application is a Continuation-in-Part (CIP) application of and claims the benefit of and priority to U.S. application Ser. No. 15/090,082, filed on Apr. 4, 2016, which application is incorporated by reference herein in its entirety.

BACKGROUND

1. Field

Embodiments of the present disclosure relate generally to systems and methods for characterization and analysis of waveform data in electrical/power systems, and more particularly, to systems and methods to analyze waveforms from multiple devices in power systems.

2. Discussion of Related Art

Intelligent Electronic Devices (IEDs), such as conventional power metering devices, are often capable of acquiring a univariate or multivariate time-series of electrical signal data samples, such as current and/or voltage data samples, over a window of time. In some IEDs, if the measured current and/or voltage signals exceed or drop below a predetermined threshold, the IED will automatically store the waveform data and generate a waveform capture, which provides a graphical representation of how a signal (e.g., a current and/or voltage signal) varies over time.

Waveform captures are typically generated by IEDs in response to unanticipated electrical events causing variations in the voltage and/or current signals in an electrical system. The results of the unanticipated electrical events can be benign, but often lead to power-quality-induced complications, including equipment damage, equipment failure, and safety concerns. The waveform capture data can be analyzed to diagnose the electrical event(s), enabling faster troubleshooting, mitigation, and resolution of the power-quality-induced complications.

SUMMARY

Described herein are systems and methods related to analyzing waveforms from multiple devices (e.g., IEDs) in electrical/power systems (hereinafter, referred to as "power systems" for simplicity). The power systems may be associated with at least one load, process, building, facility, watercraft, aircraft, or other type of structure, for example. The power systems may be monitored and/or controlled by one or more power monitoring systems, for example.

In one aspect of this disclosure, a method for analyzing waveform capture data in a power system includes measuring electrical signals in the power system using a plurality of IEDs. At least one electrical event is detected in the power system based on the measured electrical signals from the plurality of IEDs, and in response to detecting the at least one electrical event, at least two waveform captures are generated on the plurality of IEDs as a result of the at least one electrical event. The at least two waveform captures are analyzed on at least one controller coupled to the plurality of IEDs to identify at least one associated characteristic/trait from the at least two waveform captures. The at least one associated characteristic/trait is classified based on at least one of the analysis of the at least two waveform captures and the at least one associated characteristic/trait, and at least one potential relevancy of at least one of the at least one associated characteristic/trait and the classification(s) of the at least one associated characteristic/trait to the power system is determined.

In accordance with some embodiments of this disclosure, one or more actions may be taken based on the determined at least one potential relevancy of at least one of the at least one associated characteristic/trait and the classification(s) of the at least one associated characteristic/trait to the power system using the above-discussed method (and/or other systems and/or methods discussed herein). For example, in some embodiments the one or more actions taken may include providing an indication of the determined at least one potential relevancy via at least one of: a report, a text, an email, audibly, and an interface of a screen/display. Additionally, in some embodiments the one or more actions taken may include changing or adjusting one or more parameters associated with at least one electrical component, system and/or device in the power system based on the determined at least one potential relevancy. In another embodiment, information (e.g., classifications of event as voltage sag with impact as relevancy) may be sent to another system (e.g., a manufacturing SCADA system, controlling the manufacturing process), so as to allow this other system to take action.

In some embodiments, the above-discussed method (and/or other systems and/or methods discussed herein) may be implemented on the plurality of IEDs and/or the at least one controller called for in the above-discussed method. Additionally, in some embodiments the above-discussed method may be implemented partially or fully remote from the plurality of IEDs and/or the at least one controller, for example, in a gateway, a cloud-based system, on-site software, a remote server, etc. (which may alternatively be referred to as a "head-end" or "Edge" system herein). In some embodiments, the at least one controller may be associated with the gateway, the cloud-based system, the on-site software, the remote server, etc. Additionally, in some embodiments the at least one controller may be associated with at least one of the plurality of IEDs and/or a control system or device coupled to the plurality of IEDs, as a few examples. Examples of the plurality of IEDs may include a smart utility meter, a power quality meter, and/or another measurement device (or devices). The plurality of IEDs may include breakers, relays, power quality correction devices, uninterruptible power supplies (UPSs), filters, and/or variable speed drives (VSDs), for example. Additionally, the plurality of IEDs may include at least one virtual meter in some embodiments.

The above-discussed method (and/or other systems and/or methods discussed herein) may include one or more of the following features either individually or in combination with other features in some embodiments. For example, in some embodiments the electrical signals measured using the plurality of IEDs may include at least one of a voltage signal, a current signal, input/output (I/O) data, and a derived or extracted value. In some embodiments, the I/O data includes at least one of a digital signal (e.g., two discrete states) and an analog signal (e.g., continuously variable). The digital signal may include, for example, at least one of on/off status(es), open/closed status(es), high/low status(es), synchronizing pulse and any other representative bi-stable signal. Additionally, the analog signal may include, for example, at least one of temperature, pressure, volume, spatial, rate, humidity, and any other physically or user/usage representative signal.

In accordance with some embodiments of this disclosure, the derived or extracted value includes at least one of a calculated, computed, estimated, derived, developed, interpolated, extrapolated, evaluated, and otherwise determined additional energy-related value from at least one of the measured voltage signal and/or the measured current signal. In some embodiments, the derived value additionally or alternatively includes at least one of active power(s), apparent power(s), reactive power(s), energy(ies), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s), spectral analysis and/or other similar/related parameters. In some embodiments, the derived value additionally or alternatively includes at least one energy-related characteristic, the energy-related characteristic including magnitude, direction, phase angle, percentage, ratio, level, duration, associated frequency components, energy-related parameter shape, and/or decay rate. In accordance with some embodiments of this disclosure, the derived or extracted value may be linked to at least one process, load(s) identification, etc., for example.

It is understood that the electrical signals measured using the plurality of IEDs may include (or leverage) substantially any electrical parameter derived from at least one of the voltage and current signals (including the voltages and currents themselves), for example. It is also understood that the electrical signals may be continuously or semi-continuously captured/recorded and/or transmitted and/or logged by the plurality of IEDs, and electrical events detected based on the electrical signals may be updated (e.g., evaluated/re-evaluated, prioritized/re-prioritized, tracked, etc.) in response thereto. For example, electrical events may initially be detected from electrical signals captured at a first time, and may be updated or revised (e.g., recharacterized, reclassified, or used to identify new potential relevancy(ies)) in response to variation(s)/change(s) identified from electrical signals captured at a second time.

In some embodiments, the plurality of IEDs measuring the electrical signals includes at least one metering device. The at least one metering device may correspond, for example, to at least one metering device in the power system for which the electrical signals are monitored.

As used herein, an IED is a computational electronic device optimized to perform a particular function or set of functions. Examples of IEDs include smart utility meters, power quality meters, microprocessor relays, digital fault recorders, and other metering devices. IEDs may also be imbedded in VSDs, uninterruptible power supplies (UPSs), circuit breakers, relays, transformers, or any other electrical apparatus. IEDs may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

It is understood that an input is data that a processor and/or IED (e.g., the above-discussed plurality of IEDs) receives, and an output is data that a processor and/or IED sends. Inputs and outputs may either be digital or analog. The digital and analog signals may be both discrete variables (e.g., two states such as high/low, one/zero, on/off, etc. If digital this may be a value. If analog, the presence of a voltage/current may be considered by the system/IED as an equivalent signal) or continuous variables (e.g., continuously variable such as spatial position, temperature, pressure voltage, etc.). They may be digital signals (e.g., measurements in an IED coming from a sensor producing digital information/values) and/or analog signals (e.g., measurements in an IED coming from a sensor producing analog information/values). These digital and/or analog signals may include any processing step within the IED (e.g., derive a Power Factor, a magnitude, among all the derived calculations).

Processors and/or IEDs may convert/reconvert digital and analog input signals to a digital representation for internal processing. Processors and/or IEDs may also be used to convert/reconvert internally processed digital signals to digital and/or analog output signals to provide some indication, action, or other response (such as an input for another processor/IED). Typical uses of digital outputs may include opening or closing breakers or switches, starting or stopping motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data and/or in proportional control schemes.

A few more examples where digital and analog I/O data are leveraged may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

As noted earlier in this disclosure, the electrical signals measured by the plurality of IEDs may include I/O data. It is understood that the I/O data may take the form of digital I/O data, analog I/O data, or a combination digital and analog I/O data. The I/O data may convey status information, for example, and many other types of information, as will be apparent to one of ordinary skill in the art from discussions above and below.

It is understood that the terms "processor" and "controller" are sometimes used interchangeably herein. For example, a processor may be used to describe a controller. Additionally, a controller may be used to describe a processor.

In accordance with some embodiments of this disclosure, the disclosed systems and methods for analyzing waveform capture data call for identifying IEDs of the plurality of IEDs that did not detect at least one electrical event from the electrical signals measured by the plurality of IEDs. In response to identifying IEDs that did not detect the at least one electrical event, at least one reason the identified IEDs did not detect the at least one electrical event may be established/determined. The at least one established/determined reason may indicate or include, for example, at least one factor explaining why the at least one electrical event was not detected by the identified IEDs.

In accordance with some embodiments of this disclosure, at least one level/degree of confidence (or certainty) may be generated based on at least one of the analysis of the at least two waveform captures generated by the plurality of IEDs, the classification(s) of the at least one associated characteristic/trait from the at least two waveform captures, and the determined at least one potential relevancy of at least one of the at least one associated characteristic/trait and the classification(s) of the at least one associated characteristic/trait to the power system. In accordance with some embodiments of this disclosure, the at least one level/degree of confidence may be indicated, for example, by at least one of a confidence factor, probability, certainty, color, graphical representation, light, number, percentage, sound, vibration, rank, warning/alarm, and trigger for action.

In accordance with some embodiments of this disclosure, the trigger for action may be related to the one or more actions taken based on the determined at least one potential relevancy of at least one of the at least one associated characteristic/trait and the classification(s) of the at least one associated characteristic/trait to the power system. The trigger for action may initiated, for example, in response to the at least one level/degree of confidence falling below or above one or more prescribed thresholds. The prescribed thresholds may include at least one static threshold, and/or at least one dynamic threshold. The at least one dynamic threshold may change, for example, in response to changes in the power system. The changes in the power system may be detected, for example, from the electrical signals captured by the plurality of IEDs in the power system. In one example implementation, the changes are detected after manually training/teaching a system to identify the changes. For example, the specific equipment (or processes) operating at a given time may be described to allow the system to learn (i.e., a form of machine learning). In another example implementation, the changes are automatically detected based on changepoints or clusters/groups identification (e.g., using machine learning algorithms according to state of the art in this field).

In accordance with some embodiments of this disclosure, at least one of the plurality of IEDs and/or other systems and/or devices further generates non-waveform capture data. The non-waveform capture data may be used, for example, in the analysis of the at least two waveform captures, the classification(s) of the at least one associated characteristic/trait, and the determination(s) of the at least one potential relevancy, and the determination of at least one confidence level/degree. The non-waveform capture data may include, for example, at least one of input/output (I/O) data (e.g., a status change on the motor I/O stating that motor was started, status indicator was changed to "ON") and event data (e.g., a "voltage sag alarm on phase AB") and measurement logged data (e.g., the voltage magnitude of phase AB is logged) captured in response to detecting the at least one electrical event. Additionally, the non-waveform capture data may include classifications, metadata, reference to Modbus registries or values, event labels or tags, and other relevant information that is not the waveform capture data.

It is understood that waveform captures and non-waveform data captures may be triggered (i.e., initiated) through/by a number of means. They may be triggered, for example, by an electrical event such as a voltage sag, voltage transient, current swell, frequency deviation, excessive total harmonic distortion (THD), voltage and/or current imbalance, undervoltage and/or overvoltage condition, voltage fluctuation, and so forth. They may also be triggered in response to an internal prompt (i.e., via IED firmware) and/or an external prompt (i.e., independent of the IED, such as by a Power SCADA system for example). The internal prompts may originate from an IED's algorithms or firmware, which may detect one or more conditions that have been met. These internally-sourced conditions may arise from (or be derived from) the direct input of electrical signals (e.g., measured signals and/or derived data), internal temporal mechanisms (e.g., timers, clocks, etc.), manually/forced (e.g., initiated directly at the IED human machine interface (HMI) and/or remotely), internal control signal(s)/system(s), internal algorithms (e.g., metering, custom applications, etc.) and/or some combination thereof. Externally-sourced conditions may arise from (or be derived from) the same type sources as internally-sourced conditions; however, their origin is external to the IED and/or its direct inputs. For example, externally-sourced conditions may initiate/trigger a waveform capture(s) due to external electrical signal(s), external temporal mechanism(s), external manual/forced means (local and/or remote), external control signal(s)/system(s), external algorithm(s), or some combination thereof. Moreover, internally-sourced and externally-sourced conditions may be used independently or in concert with triggered waveform captures. Temporal mechanisms may incorporate at least one of a periodic, pseudo-random, and/or indiscriminate/random technique(s)/method(s)/approach(es) to determine whether a condition (e.g., energy-related condition, or non-energy related condition) is met to trigger a waveform capture and/or to determine what contextual conditions are normal when no trigger of a waveform capture is met.

In accordance with some embodiments of this disclosure, in addition to the waveform captures and non-waveform data captures being triggered automatically, semi-automatically, periodically, pseudo-randomly, and/or indiscriminately/randomly, for example, as discussed above, the waveform captures and non-waveform data captures may be triggered manually (e.g., through a button press, voice command, remotely, etc.) and/or through or by any other means as understood by of ordinary skill in the art. It is understood that triggers may generally be referred to as energy-related triggers or non-energy related triggers. The energy-related triggers may be initiated, for example, in response to one or more energy-related events or conditions (e.g., electrical events or conditions, as discussed above). Additionally, the non-energy related triggers may be initiated in response to one or more non-energy related events or conditions (i.e., events or conditions besides energy-related events or conditions).

In one embodiment, a non-energy related trigger includes a trigger to generate at least two waveform captures on the plurality of IEDs and/or a trigger of non-energy related events. In one embodiment, the non-energy related trigger may be received and/or detected directly by at least one of the plurality of IEDs. In another embodiment, the non-energy related trigger may be received and/or detected by at least one other system and/or device besides the plurality of IEDs, and subsequently communicated by the at least one other system and/or device to the plurality of IEDs. For example, in embodiments in which the non-energy related trigger includes a trigger to generate at least two waveform captures on the plurality of IEDs, the non-energy related trigger may be received and/or detected by the at least one other system and/or device, and subsequently be communicated to the plurality of IEDs. The plurality of IEDs may then, in turn, generate the at least two waveform captures in response to the communication from the at least one other system and/or device. It is understood that the non-energy related trigger may be initiated and detected in a variety of manners. For example, the non-energy related trigger may be initiated by a button press, a voice command, remotely (e.g., from software, gateway or another device), etc., and subsequently detected by at least one system and/or device capable of interpreting the button press, voice command, etc.

In accordance with some embodiments of this disclosure, the at least two waveform captures (e.g., generated in response to the above-discussed triggers and/or in response to the plurality of IEDs detecting the at least one electrical event) are at least one of analyzed, classified and used to determine the at least one potential relevancy based on at least one of location(s), type(s), load(s), load type(s), process(es), application(s), user input(s), metadata, functionality(ies) of the plurality of IEDs capturing the at least two waveform captures, and factors calculated or derived from other analysis or observations. The factors calculated or derived from other analysis or observations may include, for example, at least one of: impact(s), severity(s), distance(s), grouping(s), electrical event criticality(ies), energy-related parameter(s), derived characteristic(s), setting(s), configuration(s), event duration(s), solution(s)/mitigation(s), cost(s), stimulate(s), induce(s), effect(s), recovery time duration(s), significance(es), loss(es), attenuation(s), process signal(s), load signal(s), status change(s), other change(s), attribute(s).

It is understood that the term "waveform capture," as used herein, may also refer to a "signal capture." Thus, the at least two waveform captures discussed above and through this disclosure, may also be understood as being at least two signal captures. The signal capture(s) may include at least one of a voltage signal and a current signal, for example.

It is also understood that an electrical event may refer to any type of electrical occurrence of interest. What is considered an electrical event for one installation, for example, may not be considered as an electrical event for another installation. Accordingly, a "power quality" event, for example, is an electrical occurrence of interest that is generally recognized as an electrical event that may adversely impact the operation and/or equipment installed on an electrical system.

It is also understood that some electrical event data (e.g., disturbance event) may not be in the form of a waveform capture, but may still be useful to the above and below discussed analysis performed using the systems and methods disclosed herein. For example, some electrical event data may be in the form of non-waveform capture data, such as event log data indicative of the electrical event data. The event logged data may include, for example, event metrics (e.g., event timestamp, magnitude, duration, event pickup, event dropout, event ID, data related to ITIC, alarm message, additional descriptive text).

In accordance with some embodiments of this disclosure, at least one of the plurality of IEDs influences the analysis more heavily than another of the plurality of IEDs. Additionally, in accordance with some embodiments of this disclosure, at least one of the at least two waveform captures influences at least one of: the analysis of the at least two waveform captures, the classification(s) of the at least one associated characteristic/trait, and the determination(s) of the at least one potential relevancy, more heavily than another one of the at least two waveform captures. An amount/level/degree of the influence on the analysis of the at least two waveform captures, for example, may be based on at least one of location(s), type(s), load(s), process(es), application(s), user input(s), metadata, functionality(ies) of the plurality of IEDs capturing the at least two waveform captures, and factors calculated or derived from other analysis or observations. The factors calculated or derived from other analysis or observations may include, for example, at least one of: magnitude, phase angle, frequency component, impact, phase, shape, duration, time of occurrence, electrical parameter, change, attribute(s) of the at least two waveform captures from the plurality of IEDs. In accordance with some embodiments of this disclosure, the amount/level/degree of the influence may be indicated or represented by a weighting factor, for example.

In accordance with some embodiments of this disclosure, the at least one associated characteristic/trait identified from the at least two of the waveform captures includes at least one of similarity(ies) and dissimilarity(ies) associated with, or derived from, the at least two of the waveform captures. In some instances, the similarity(ies) and dissimilarity(ies) may additionally be associated with, or derived from, non-waveform data (e.g., status changes, logged data, etc.). The non-waveform data may be received, for example, from at least one of the plurality of IEDs and/or other systems and/or devices (e.g., a control system and/or device, sensor system and/or device, etc.) associated with the power system.

The similarity(ies) and dissimilarity(ies) may include, for example, at least one of: increases, decreases, differences, discrepancies, deviations, alterations, changes in energy-related parameters associated with the at least two waveform captures. In accordance with some embodiments of this disclosure, the similarity(ies) and dissimilarity(ies) are associated with at least one of shape (including curve, magnitude, duration, and/or other characteristics related to a waveform's form) of the at least two of the plurality of waveform captures. Additionally, in accordance with some embodiments of this disclosure the dissimilarity(ies) include at least one of: incongruencies (e.g., a notch into or out of the signal present on only one of all the waveforms/IEDs, but not on any of the other captured waveforms/IEDs), variations (e.g., in magnitude or presence, such as a decrease in high frequency components as the IEDs are further away from the source of the event) and distinctions (e.g., on some waveforms/IEDs we may have a notch into the curve vs. on other IEDs one may have a notch out of the curve).

According to another aspect of the disclosure, a method for analyzing waveform capture data includes receiving, by a controller from an IED, waveform capture data indicative of an electrical event, extracting, from the waveform capture data, electrical event data, extracting additional data from memory and/or any logged data associated with the controller and/or from other inputs, classifying the waveform capture data into a category of a plurality of categories using the electrical event data, comparing the electrical event data and the additional data to stored data, diagnosing the electrical event and a cause of the electrical event based on the comparison, and providing an indication of the cause of the electrical event.

In one embodiment, the additional data includes at least one of metadata, event data and IED information/characteristics. In another embodiment, the method further includes analyzing waveform capture data that includes waveform disturbances caused by known electrical events, and transmitting and/or writing analysis results into the stored data. In one embodiment, the method further includes automatically mitigating the cause of the electrical event. According to one embodiment, the method further includes storing and/or sending a diagnosis of the electrical event and the cause of the electrical event in a file. In some embodiments, the diagnosis of the electrical event and the cause of the electrical event are stored using a .CAT file format. In one embodiment, the diagnosis of the electrical event and the cause of the electrical event are stored using one or more of an XML format, a PQDIF format and a COMTRADE format. According to some embodiments, the method further includes requesting additional information from an IED and/or other system (e.g., a SCADA system). In one embodiment, the method further includes modifying a diagnosis based in part on the additional information.

Systems for analyzing waveform capture data in a power system are also disclosed herein. In one aspect, a system for analyzing waveform capture data in a power system includes at least one controller/processor and at least one memory device coupled to the at least one controller. The at least one controller and the at least one memory device may be configured to receive at least two waveform captures from a plurality of IEDs in the power system, the at least two waveform captures generated by the plurality of IEDs as a result of at least one electrical event detected in the power system by the plurality of IEDs. The at least two waveform captures are analyzed on the at least one controller to identify at least one associated characteristic/trait from the at least two waveform captures.

The at least one associated characteristic/trait is classified based on at least one of the analysis of the at least two waveform captures and the at least one associated characteristic/trait, and at least one potential relevancy of at least one of the at least one associated characteristic/trait and the classification(s) of the at least one associated characteristic/trait to the power system is determined. In accordance with some embodiments of this disclosure, one or more actions may be taken based on the determined at least one potential relevancy of at least one of the at least one associated characteristic/trait and the classification(s) of the at least one associated characteristic/trait to the power system.

In accordance with some embodiments of this disclosure, the above-described system may correspond to a control system used for monitoring or controlling one or more parameters associated with the power system. In some embodiments, the control system may be a meter, an IED (e.g., of the plurality of IEDs responsible for measuring the electrical signals), programmable logic controller (PLC), on-site/head-end software (i.e., a software system), a cloud-based control system, a gateway, a system in which data is routed over the Ethernet or some other communications system, etc.

According to another aspect of the disclosure, a waveform analysis system is provided. The system includes at least one IED, and a controller having at least one memory and configured to receive waveform capture data from the at least one IED, the waveform capture data being indicative of an electrical event, extract electrical event data from the waveform capture data, extract additional data from the at least one memory, classify the waveform capture data into a category of a plurality of categories using the electrical event data, compare the electrical event data and the additional data to stored data, diagnose the electrical event and a cause of the electrical event based on the comparison, and provide an indication of the cause of the electrical event.

In one embodiment, the additional data includes at least one of metadata, event data and IED information. In some embodiments, the controller is further configured to analyze waveform capture data including waveform disturbances caused by known electrical events, and write analysis results into the at least one memory. According to some embodiments, the controller is further configured to automatically mitigate the cause of the electrical event. In one embodiment, the controller is further configured to store a diagnosis of the electrical event and the cause of the electrical event in a file. In some embodiments, the file is stored using a .CAT file format. According to one embodiment, the file is stored using one or more of an XML format, a PQDIF format and a COMTRADE format. In some embodiments, the controller is further configured to request additional information from the at least one IED. In one embodiment, the controller is further configured to modify a diagnosis based in part on the additional information.

According to a further aspect of the disclosure, a waveform analysis system includes at least one IED, and means for receiving waveform capture data from the at least one IED, extracting electrical event data from the waveform capture data, extracting additional data from one or more storage devices, and diagnosing an electrical event and a cause/source of the electrical event from the electrical event data and the additional data. In one embodiment, the means further comprises means for automatically mitigating the cause of the electrical event based on a diagnosis of the electrical event and the cause of the electrical event.

It is understood that the systems and methods described herein may be responsive to changes in the power system(s) in which the systems and methods are provided and/or implemented. For example, the type(s), number(s), location(s), etc. of electrical event(s) detected in the power system(s) may change in response to changes (e.g., addition of further IEDs, loads, etc.) in the power system(s). The changes in the power system(s) may be detected, for example, from the electrical signals measured by the plurality of IEDs in the power system(s). In one example implementation, the changes are detected after manually training/teaching a system to identify the changes. For example, the specific equipment (or processes) operating at a given time may be described to allow the system to learn (i.e., a form of machine learning).

It is understood that there are many other features and advantages associated with the disclosed invention, as will be appreciated from the discussions below.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 4 is a table illustrating power quality classifications;

DETAILED DESCRIPTION

Figure 1:
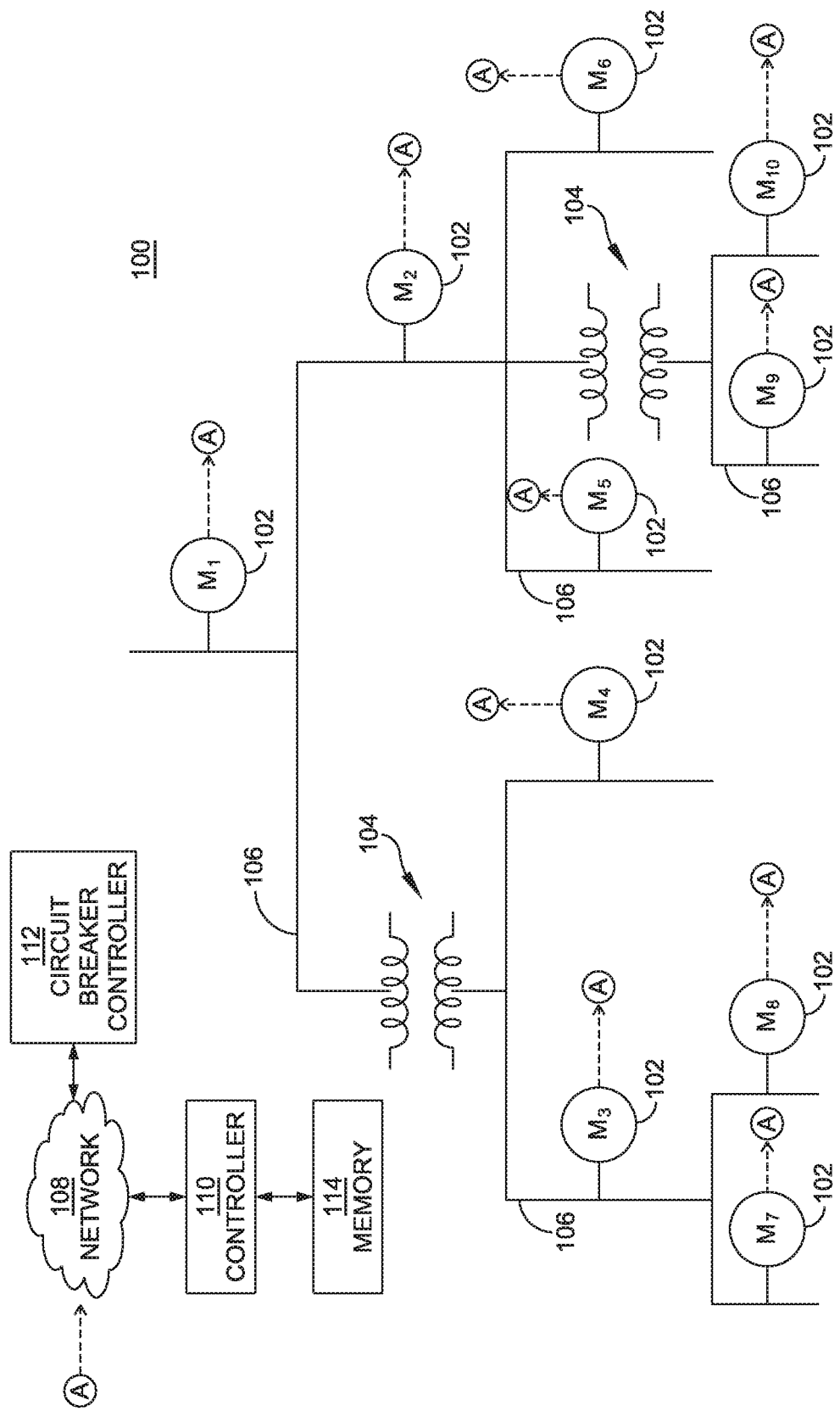
FIG. 1 is a block diagram illustrating a power monitoring system.

Embodiments of this invention are not limited in their application to the details of construction and the arrangement of components set forth in the following description or illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Analyzing waveform captures derived from waveform capture data is an effective method of troubleshooting potentially-harmful electrical events (e.g., an undesirable voltage sag or voltage swell on the electrical system). Human operators are typically required to diagnose an electrical event from a waveform capture, which can be difficult or even impossible without years of experience. As discussed above, an IED such as a power metering device is typically configured to monitor and record a time-series of data samples, and may be equipped with waveform capture technology to generate waveform captures in response to electrical events. However, each waveform capture must be manually analyzed by an experienced specialist to diagnose an electrical event. Manual data review by an operator is a slow and inefficient means of troubleshooting electrical events, as will be described in greater detail below with respect to FIG. 1.

FIG. 1 illustrates a power monitoring system 100 for monitoring voltage, current, frequency, power, energy and/or other related values measured by one or more IEDs in a power system. The power monitoring system 100 includes one or more IEDs 102, one or more transformers 104, an interconnection element 106, a network 108, a controller 110, a circuit breaker controller 112, and a memory element 114. In some embodiments, certain components (e.g., the circuit breaker controller 112) may be distinct from the one or more IEDs 102, while in other embodiments, the components (e.g., the circuit breaker controller 112) may be classified as IEDs themselves (e.g., classified as one or more of the one or more IEDs 102).

Each of the one or more IEDs 102 is coupled to at least one of the one or more transformers 104 via the interconnection element 106, and each of the one or more IEDs 102 is further coupled to the network 108. Each of the one or more transformers 104 is coupled to at least one of the one or more of the IEDs 102 via the interconnection element 106. The network 108 is coupled to each of the one or more IEDs 102, the controller 110 and the circuit breaker controller 112. The controller 110 is coupled to the network 108 and the memory element 114. The circuit breaker controller 112 is coupled to the network 108. The memory element 114 is coupled to the controller 110.

In some embodiments, one or more of the components of the power monitoring system 100 may be not connected to the network 108. For example, one or more of the one or more IEDs 102 may not be coupled to the network 108. Instead, the IEDs can display waveform data information via a front panel proximate to, or affixed to, each of the IEDs rather than providing the waveform data to the network 108. Furthermore, the circuit breaker controller 112 may be connected directly to each of the one or more IEDs 102 (e.g., via the I/O functionality of each of the one or more IEDs 102) in lieu of, or in addition to, being connected to the network 108.

In some embodiments, each of the one or more IEDs 102 is capable of measuring waveform data (e.g., voltages, currents, power, etc.) and automatically generating graphical waveform captures of the waveform data when an electrical event is detected (e.g., due to an undesirable voltage sag or swell on the electrical system). In alternate embodiments, each of the one or more IEDs 102 is capable of measuring waveform data, and the waveform capture data is utilized by an external entity (e.g., a head-end system [e.g., software], an alternate display mechanism, etc.) to generate a graphical waveform capture. In one example, an IED (e.g., M1) of the one or more IEDs 102 may detect an electrical event and generate a waveform capture that illustrates the electrical event, as described in more detail below with respect to FIGS. 2 and 3. In further embodiments, only a subset of the IEDs 102 are configured to measure waveform data and automatically generate graphical waveform captures as discussed above.

As discussed above, manual review of waveform captures is an inefficient and often difficult method of diagnosing electrical events, especially for inexperienced operators. In one embodiment, the controller 110 receives waveform capture data, automatically evaluates the waveform capture data and diagnoses an electrical event and a cause thereof using IED information, metadata and event data.

IED information includes information descriptive of the IED, and in some cases, the associated system that acquired the waveform capture. For example, the IED information can include an IED's sampling rate, IED anti-aliasing capabilities, IED accuracy, IED configuration information, IED potential transformer (PT) and current transformer (CT) information, IED PT/CT ratio information, IED power quality capabilities, IED blind or zero-blind sampling characteristics, IED system type, IED system time synchronization information, IED system clock accuracy, and other characteristics inherent to the IED.

Metadata includes data indicative of the context in which the waveform capture data was acquired. For example, the metadata can include load type information (e.g., motors, heaters, lighting, computers, variable speed drives, etc.), load characteristic information (e.g., standard induction motors exhibit large inrush currents when started, 6-pulse DC drives exhibit harmonic components at the $5^{th}$, $7^{th}$, $11^{th}$, $13^{th}$, $17^{th}$, $19^{th}$, etc. frequencies, etc.), IED locational information (i.e., where within the facility or structure), IED hierarchical information (e.g., how IEDs relate to each other within the monitoring system, etc.), utility service type information (e.g., delta-wye, wye-wye, open-delta-open-wye, etc.), temporal and seasonal information (e.g., time of year, time of day, day of week, month of year, week of year, etc.), environmental information (e.g., associated temperature(s), humidity, inclement weather, etc.), user information (e.g., purpose of business, location of business, operational priorities, etc.), user's operational characteristics (e.g., how is the electrical system controlled, does the facility(s) operate constantly or only certain hours of the day, what is the duty cycle of specific loads, etc.), other systems which may be source of events or impacted by events (e.g., a manufacturing SCADA system, controlling at least one of the manufacturing processes, or a Building Management System controlling the HVAC) and so forth.

Event data includes data descriptive of the electrical event. For example, the event data can include instantaneous time-series waveform data, RMS time-series waveform data, event magnitude, event duration, units (e.g., mV, V, kV, mA, A, kA, kW, kWh, kVA, kVAh, kVAr, kVArh, %, etc.), unit range or scale, affected phase or phases (e.g., A-phase, B-phase, C-phase, neutral conductor, ground conductor, etc.), synchronicity of the electrical event on the affected phases, number of system phases (i.e., three-phase, single-phase, etc.), non-fundamental frequency data associated with the event, oscillatory information, symmetry of event, initial polarity of event (e.g., into the waveform, out of the waveform, negative, positive, etc.), event location (e.g., upstream from IED, downstream from IED, etc.), recurrence and repetition information (e.g., whether or not the event is repetitive, how often the event recurs, etc.), date and time data, onset rate characteristics, recovery rate characteristics (e.g., decay rate, etc.), periodicity information (e.g., periodic, aperiodic, intermittent, etc.), frequency correlation (between two or more IEDs) information, affected device information, pre-event data, event data, post-event data, and so forth.

In at least one example, the event data, metadata and IED information are each stored in one or more information libraries. The one or more information libraries may be stored in a memory element (e.g., memory element 114) internal to the controller 110 in some embodiments, while in other embodiments, the information libraries may be externally stored from the controller 110. The controller 110 is operable to access the one or more libraries and update the stored information according to a schedule (e.g., periodically, a-periodically, automatically, manually, etc.). For example, the controller 110 can poll one or more libraries containing information and data that is relevant to electrical event diagnoses, including, for example, libraries containing up-to-date power quality classification standards, up-to-date IED information, up-to-date metadata information, historical information describing previous electrical event diagnoses, and so forth. Accordingly, the controller 110 is kept readily apprised of information used to accurately determine diagnoses.

Furthermore, each characteristic within the information discussed above may be used for one or more applications. Example applications include being used in an electrical event classification stage, being used to diagnose a cause of an electrical event, being used to identify a location of an electrical event, or being used to assess the limitations of an IED used to generate a waveform capture. A combination of the preceding applications can be used to evaluate and mitigate problematic electrical events.

Referring to FIGS. 2-10, flowcharts (or flow diagrams) and other figures are shown to illustrate various methods and aspects of the disclosure for analyzing waveform capture data in a power system. Rectangular elements (typified by element 204 in FIG. 2) in the flowcharts, as may be referred to herein as "processing blocks," may represent computer software and/or IED algorithm instructions or groups of instructions, for example.

Figure 9:
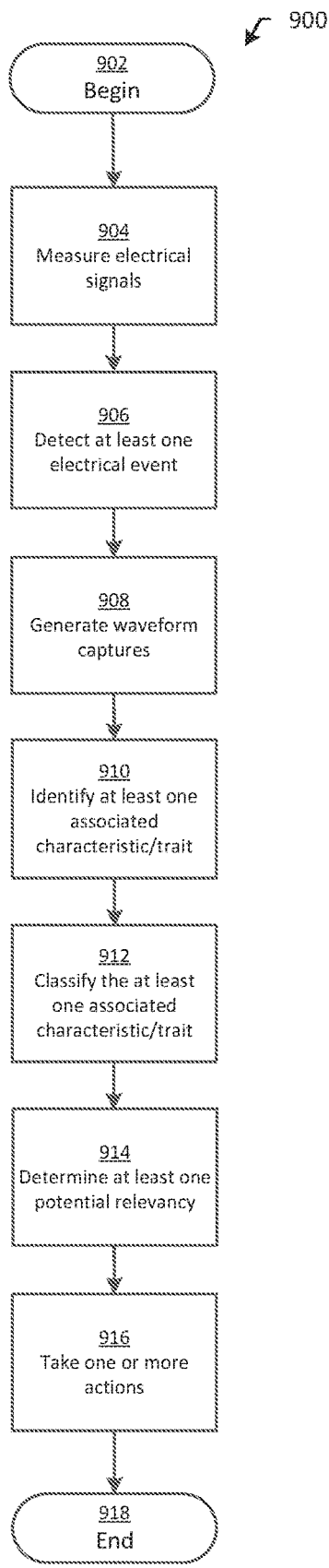
FIG. 9 is a flow diagram illustrating another example method of automatically analyzing a waveform capture.
Figure 10:
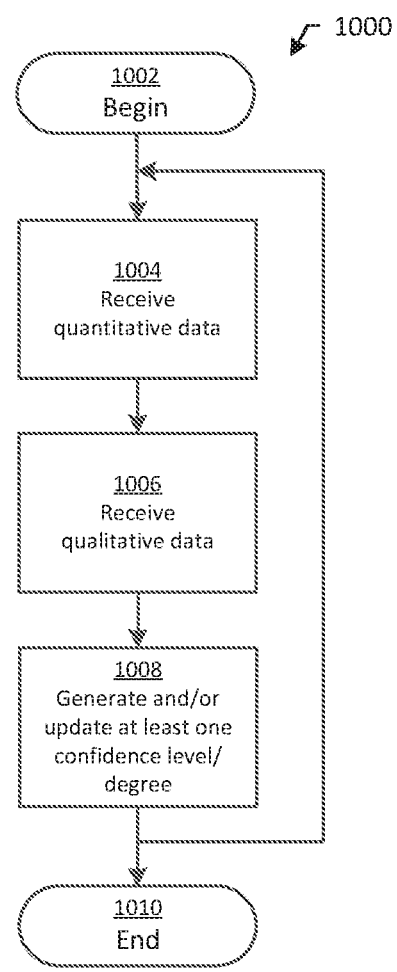
FIG. 10 is a flow diagram illustrating an example method of generating at least one level/degree of confidence.

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with analyzing waveform capture data in a power system. It is also understood that various features from the flowcharts described below may be separated in some embodiments. For example, while the flowcharts illustrated in FIGS. 2, 9 and 10 are shown having many blocks, in some embodiments the illustrated methods shown by these flowcharts may include fewer blocks or steps.

Figure 2:
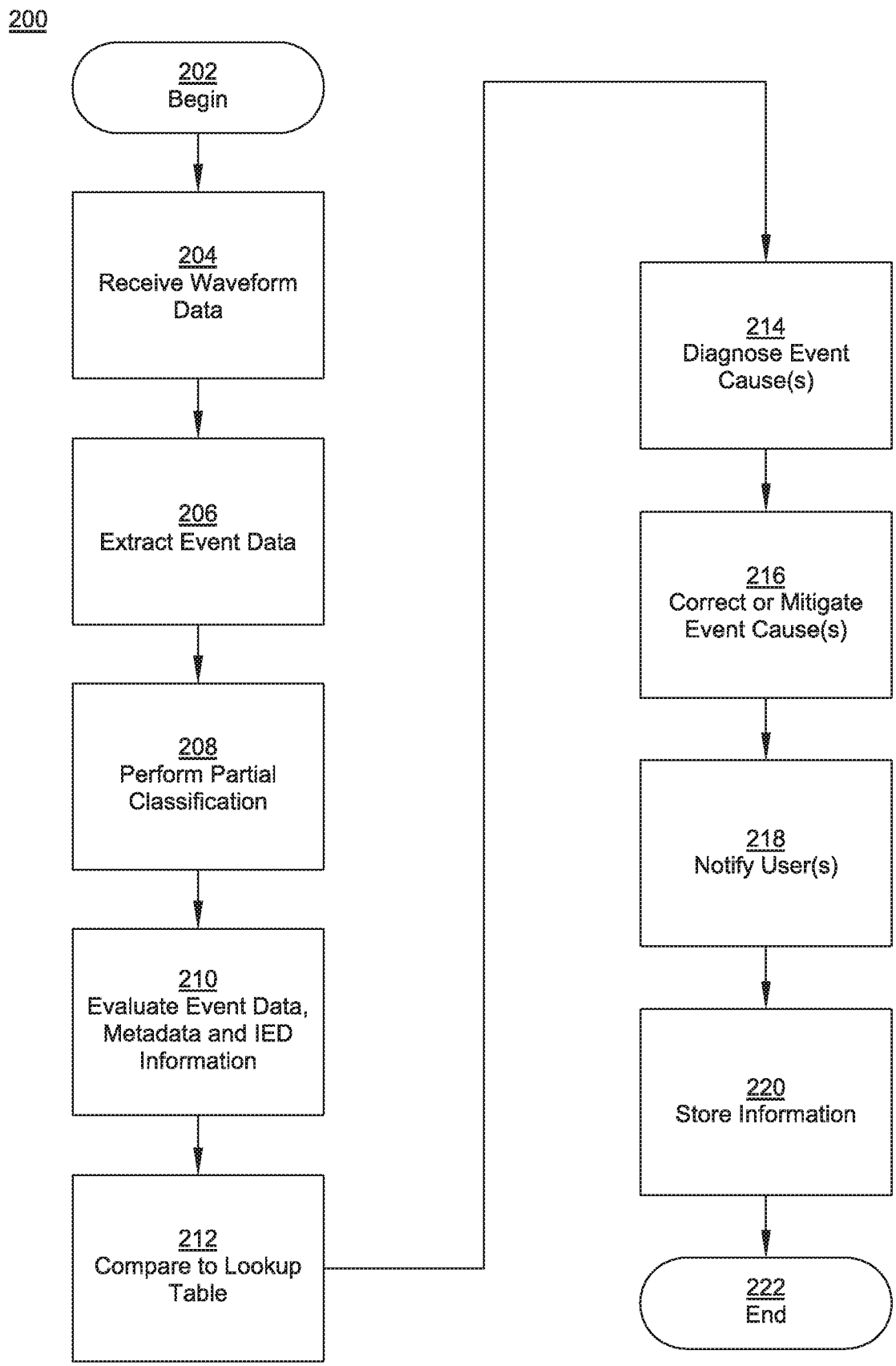
FIG. 2 is a flow diagram illustrating a method of automatically analyzing a waveform capture.
Figure 3:
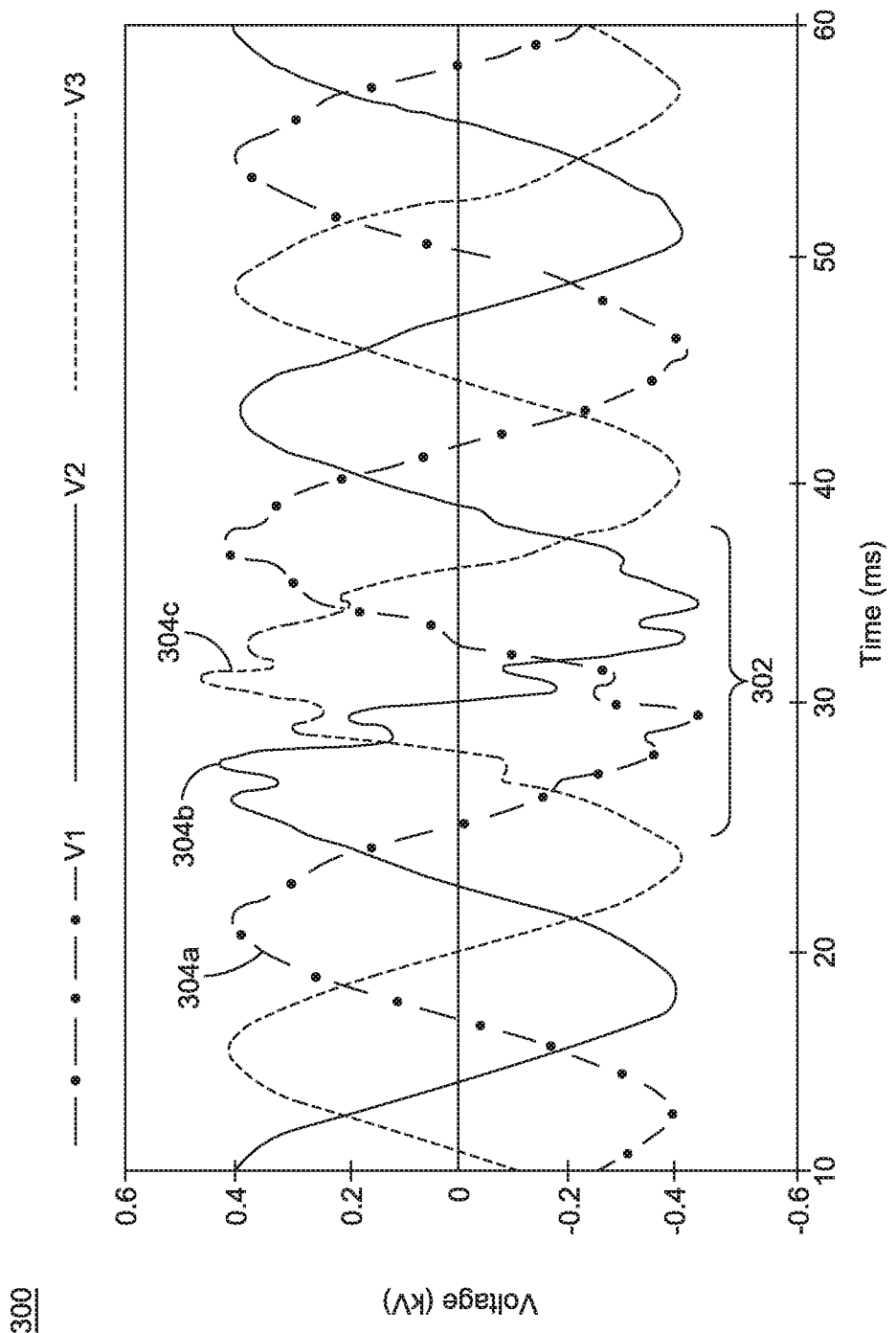
FIG. 3 is a graph illustrating a waveform capture.

FIG. 2 is a process flow diagram 200 executed by the controller 110 in one embodiment to automatically analyze a waveform capture. In other embodiments, the acts/blocks described in FIG. 2 may be done in a different order than shown, and some acts may be omitted. At act 202, the process begins. At act 204, the controller 110 receives waveform capture data (e.g., instantaneous waveform data, RMS data, etc.) from an IED (e.g., from one of the one or more IEDs 102). As described above, the occurrence of an electrical event may trigger the IED to automatically detect and capture the corresponding waveform data produced by the electrical event, generate a waveform capture from the waveform data that includes the electrical disturbance and send the waveform capture and waveform data to the controller 110 for analysis. For example, referring to FIG. 3, an example waveform capture 300 produced from the waveform capture data and sent from an IED to a monitoring system software package is shown. As illustrated by FIG. 3, the waveform capture 300 includes an electrical event 302 characterized by fluctuations in three-phase voltage signals 304a, 304b and 304c.

Referring back to FIG. 2, at act 206 the controller 110 extracts event data (e.g., sag data, swell data, notching data, oscillatory information data, etc.) from the waveform capture data. For example, with respect to the waveform capture 300, the controller 110 can extract the event's voltage magnitude data and voltage duration data from the electrical event 302. At act 208, the controller 110 performs a partial event classification on the waveform capture data using the extracted event data pursuant to a selected power quality classification standard (e.g., IEEE 1159, IEC 61000-4-30, EN50160, etc.), as discussed in greater detail below.

For example, the controller 110 may first identify the electrical event 302 as a transient, due to the duration of the electrical event 302 meeting transient classification criteria established by the selected power quality classification standard. The controller 110 may further identify the electrical event 302 as oscillatory due to the ringing effect in the voltage signals 304a, 304b and 304c discussed above. The controller 110 is therefore able to partially classify the electrical event 302 as an oscillatory transient based on the criteria defining as oscillatory transient provided by a selected power quality classification standard. The controller 110 extracts additional event data indicating that the electrical event 302 occurs synchronously in more than one of the three-phase voltage signals 304a, 304b and 304c, and that the initial polarity of the event into the waveform indicates a removal of energy from the system.

At act 210, the controller 110 evaluates the partial classification determined at act 208 against metadata, IED information and the additional event data to further refine the partial classification. For example, the controller 110 may evaluate the sampling rate of the IED that provided the waveform capture to the controller 110 to ensure that the IED is capable of accurately representing the original event signal. The controller 110 may further evaluate a time and date at which the waveform capture was acquired, the synchronicity and initial polarity of the waveform capture, and so forth. At act 212, the controller 110 compares the evaluated symptoms (e.g., represented by a partial classification, additional event data, metadata and IED information) to a lookup table including previously-stored electrical event symptoms and a diagnosed cause of the electrical event, as discussed below with respect to a Wave Shape Learning phase. In alternate embodiments, the controller 110 may compare the evaluated symptoms to a waveform library in lieu of, or in addition to, the lookup table to diagnose a cause of an electrical event. At act 214, the controller 110 diagnoses at least one potential electrical event responsible for causing the observed waveform symptoms.

In some examples, the controller 110 may determine that there are multiple causes for an electrical event, while in other examples there may be a single cause for an electrical event. In the example discussed above with respect to the electrical event 302, the controller 110 can diagnose a cause of an electrical event (e.g., a three-phase capacitor switching event) by comparing the classification information discussed above (i.e., the partial classification [e.g., as an oscillatory transient], the additional event data [e.g., voltage data, current data, event synchronicity information, event polarity information, etc.], the IED information [e.g., IED sampling rate information] and the metadata [e.g., date and time information, hierarchy information, etc.] against a lookup table or other data storage entity.

The controller 110 may also determine a location at which the electrical event occurred. For example, if the controller 110 only receives disturbance information from a single IED, and all proximate IEDs are capable of recording electrical event information, then the controller 110 can determine that the electrical event occurred proximate to the single IED. Otherwise, if the controller 110 receives disturbance information from multiple IEDs, the controller 110 may determine an electrical event location by assuming that the IED closest to the electrical event observes the most severe electrical event.

At act 216, the controller 110 automatically initiates corrective or mitigative steps to fix the diagnosed cause of the electrical event. For example, the controller 110 may have diagnosed the cause of the electrical event to be a faulty or otherwise malfunctioning component in the system (e.g., power monitoring system 100) and can send control signals to a circuit breaker controller (e.g., circuit breaker controller 112) to disconnect the malfunctioning component from the system. The controller 110 may also directly control one or more devices to function in a different mode of operation (e.g., change when a capacitor bank turns on or off, etc.). In addition, in at least one embodiment, the controller 110 can request additional information from one or more IEDs, and change control parameters of one or more IEDs to assist in determining causes of future electrical events.

At act 218, the controller 110 notifies a user(s) of the occurrence of the electrical event and the steps taken to correct the cause of the electrical event. The notification can be sent graphically, textually, or by any other means to convey information to the user. For example, the notification may be sent via email in one example, while in alternate examples, the notification may be displayed by a Graphical User Interface (GUI) dashboard or report via a smartphone, head-end software, and so forth. The notification can include information indicating the location of the electrical event, information indicating that the cause of the electrical event was, for example, a malfunctioning component, and information indicating that the controller 110 automatically took steps to disconnect the malfunctioning component from the affected system.

The notification can further include recommended steps to be taken to replace or repair the disconnected component accordingly. Furthermore, the notification can include recommended steps suggesting, for example, that a user install additional components to help mitigate an electrical event. For example, to address a capacitor switching event, the notification may include a recommendation that a user install one or more filters to mitigate or correct the issue. At act 220, the analysis information is stored for use in subsequent diagnoses. For example, analysis information stored from previous diagnoses is at least partially used by the controller 110 to determine an electrical event diagnosis at act 212, as discussed above. At act 222, the process ends.

As discussed above with respect to act 208, the controller 110 is operable to perform a partial classification of electrical events in accordance with a selected logical classification structure during a partial classification stage. The controller 110 receives waveform capture data indicative of an electrical disturbance, extracts event data therefrom as discussed above with respect to FIG. 2, and executes a series of determinations. In one example, each determination of the series of determinations is a binary determination pertaining to the waveform capture data to classify the disturbance and the disturbance's associated waveform into an electrical event category from one or more categories defined by a selected power quality classification standard.

Classification of an electrical event into a known electrical event category (e.g., partial classification) can be performed automatically by the controller 110 to streamline the identification of the cause of the electrical event, the classification being performed pursuant to a selected power quality classification standard (e.g., IEEE 1159, IEEE 519, IEC 61000-4-30, EN50160, etc.). The selected power quality classification standard can provide information that assists in determining actions that may be taken to reduce or eliminate the possibility of the identified electrical event from occurring again as discussed above. In some examples, the controller 110 may be operable to automatically execute the prescribed actions, while in other examples, the controller 110 may display the recommendation(s) to an operator in a textual, graphical or other descriptive format.

FIG. 4 illustrates a table 400 of power quality event phenomena categories proposed by a first power quality classification standard. The table 400 includes a categories section 402, a typical duration section 404 and a types section 406. For example, as discussed above with respect to FIG. 3, the electrical event 302 was identified as an oscillatory transient according to the example given, thereby corresponding to a transient category from the categories section 402 and an oscillatory type from the types section 406.

A waveform capture data can be classified into at least one of the categories (e.g., one of the categories from the categories section 402) during the partial classification stage. For example, after waveform capture data is received, the controller 110 evaluates an electrical event illustrated by the waveform capture data. In one example, the controller 110 may initially determine whether the electrical event is periodic or aperiodic. In response to a determination that the electrical event is aperiodic, the controller 110 proceeds to make a next determination, and so forth, until the controller 110 arrives at one of the one or more categories discussed above into which to classify the waveform capture.

The logical classification structure discussed above is one example of a logical structure that can be executed by the controller 110. However, in other examples, there can be a different number of determinations executed (i.e., more or less executed determinations), a different number of results from each determination, and a different number of possible categories into which to classify electrical events. Furthermore, any references to specific determinations executed above are merely examples. Additional or alternate decisions may be executed that deviate from the examples provided herein, and the sequence of decisions leading to each category, the specific number of each category and the specific contents of each category are not limited to the examples provided herein.

Additional examples of determinations to be executed can include, for example, whether the initial polarity of an electrical event is into or out of a waveform (e.g., positive or negative initial polarity, etc.), whether the electrical event is periodic or aperiodic, whether the magnitude of the electrical event is above or below a predetermined threshold, whether the duration of the electrical event is shorter or longer than a selected threshold, whether, if the electrical event is aperiodic, the aperiodic electrical event is a short-duration event, whether, if the electrical event is aperiodic, the aperiodic electrical event is a transient event, whether, if the electrical event is a transient, the transient electrical event is oscillatory or impulsive, whether, if the electrical event is periodic, if the periodic electrical event is a long-duration event, whether, if the electrical event is a long-duration electrical event, the long-duration electrical event is an interruption, whether, if the electrical event is a long-duration electrical event, the long-duration electrical event is an overvoltage, whether, if the electrical event is a long-duration electrical event, the long-duration electrical event is an undervoltage, and so forth.

The controller 110 is further operable to refine the discussed diagnostic processes by executing a Wave Shape Learning procedure on waveform captures that have known electrical event causes. By analyzing the characteristics of a waveform produced by an electrical event with known causes, the controller 110 is operable to store the analysis information in a data storage format (e.g., in a lookup table format) that associates a cause of an electrical event with the characteristic(s) of the electrical event (e.g., observed event data, metadata and TED information). For example, the controller 110 can receive waveform capture data including a disturbance, caused by a known electrical event, during the Wave Shape Learning phase to aid in subsequent diagnoses that involve substantially identical electrical events or characteristic traits. The controller 110 can receive the known waveform capture data or waveform capture from one or more sources including, for example, external information libraries, subject matter experts, and so forth.

For example, with reference to the electrical event 302, the controller 110 may identify a wave shape or wave shapes with characteristics that are substantially identical to previously-learned wave shapes, and can ascribe the stored, known cause of the previously-learned wave shape(s) to the electrical event 302. Accordingly, the controller 110 is operable to identify the cause of the electrical event 302 (e.g., a three-phase capacitor switching event), rather than simply classifying observed event or waveform characteristics of the electrical event 302 (e.g., symptoms of an oscillatory transient).

The received waveform capture information is encoded according to a consistent file format by one or more entities including, for example, software-based entities, hardware-based entities, and so forth. Once a waveform capture has been partially classified as discussed above, information describing the categorization is encoded by the controller 110 for subsequent reference by either the controller 110 or by alternate power quality analysis tools. In at least one example, the information is encoded according to a human-readable format (e.g., encoded in XML format), such as in a .CAT file, such that the encoded information is capable of being consumed by both human users (e.g., because the information is encoded in an XML format) and by computers. Accordingly, the partial classification, the event data, the metadata and the IED information are permanently synchronized by the .CAT file disclosed herein to link an electrical event to information describing the electrical event.

For example, the encoded information can include an electrical event identification tag (e.g., E1, E2, E3, etc.) that uniquely identifies an electrical event, a selected electrical event category (e.g., Category 1, CAT2, Category 8, etc.), a map listing a chain of one or more binary determination decisions made by the controller 110 to arrive at the selected electrical event category, a file containing the waveform capture data that corresponds to the electrical event, and a waveform capture file format (e.g., Common format for Transient Data Exchange for power systems [COMTRADE], Power Quality Data Interchange Format [PQDIF], etc.).

Figure 5:
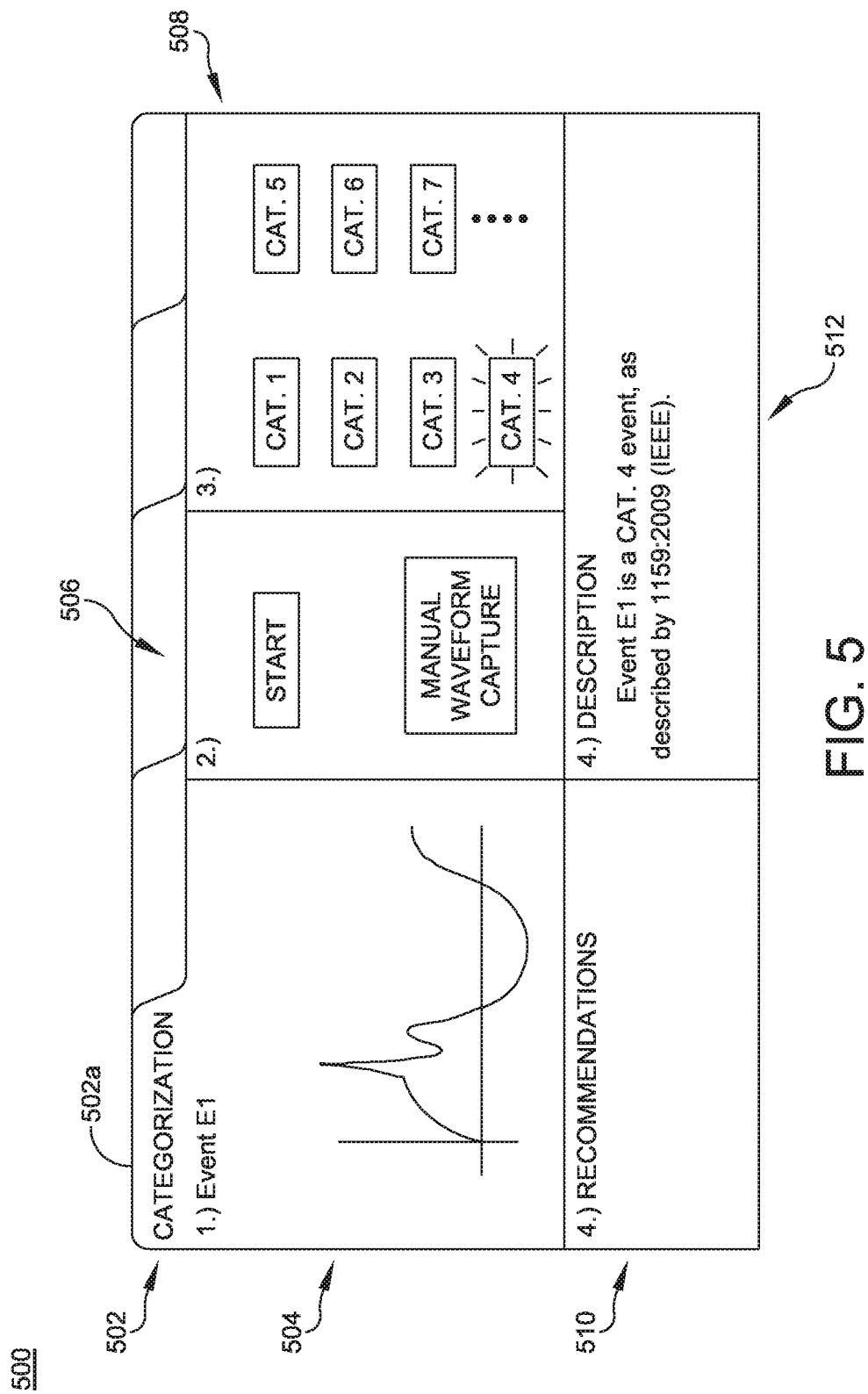
FIG. 5 is an analysis view of a graphical user interface according to one embodiment.

FIG. 5 illustrates a categorization view 500 of a software implementation of a graphical user interface used in one embodiment of the invention. For example, the controller 110 may be operable to display the categorization view 500 responsive to selection of a categorization tab 502a from one or more tabs 502. The categorization view 500 further includes waveform capture information 504, one or more buttons 506, category information 508, recommendation information 510, and event description information 512. The controller 110 may display a waveform capture in the waveform capture information 504 section upon generation of the waveform capture and, responsive to receiving selection of a start button of the one or more buttons 506, the controller 110 is operable to categorize and analyze the waveform capture data as discussed above. Alternatively, the controller 110 may display a waveform capture in the waveform capture information 504 section responsive to receiving selection of a manual waveform capture button of the one or more buttons 506.

The category information 508 section includes information describing a category into which the waveform capture has been placed, and the recommendation information 510 includes one or recommendations suggesting next steps that may be taken by a user (e.g., an operator, facility manager, etc.) to address an underlying electrical event. The event description information 512 includes information describing the waveform capture, such as categorization information and a description thereof.

Figure 6:
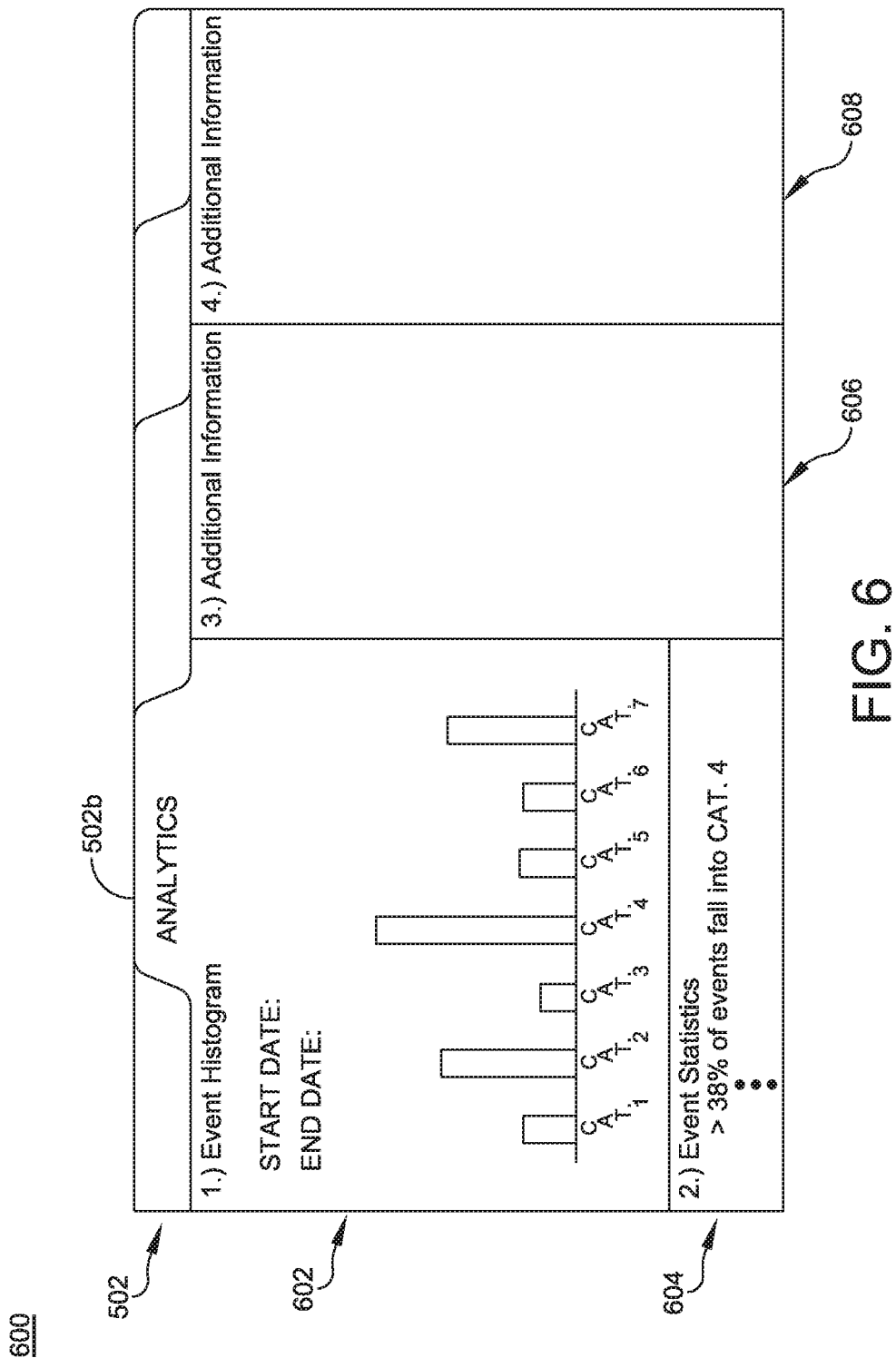
FIG. 6 is a categorization view of a graphical user interface according to one embodiment.

FIG. 6 illustrates an analysis view 600 of a software implementation of a graphical user interface in accordance with one embodiment of the invention. For example, the controller 110 may be operable to display the analysis view 600 responsive to selection of an analytics tab 502b from the one or more tabs 502. The controller 110 can transition between the categorization view 500, the analysis view 600 and any additional views responsive to selection of a tab associated with the corresponding view mode. The analysis view 600 further includes histogram information 602, event statistics 604, and additional information 606, 608. In alternate embodiments, the analysis view 600 can further include pie charts, periodicity charts (e.g., time of day, time of week, etc.), information describing the phase(s) impacted, and so forth.

The histogram information 602 section can include start date and end date settings and, responsive to user specification of a start date and end date, the controller 110 is operable to display a histogram in the histogram information 602 section that represents electrical event categorizations within the selected date range. The event statistics 604 section can expand on the histogram information 602 by displaying statistics pertaining to the histogram information 602. For example, the event statistics 604 section can include a notification that a certain percentage of electrical events fall within a certain category, and so forth. The additional information sections 606, 608 can include further information expanding on, or independent from, the histogram information 602.

Figure 7:
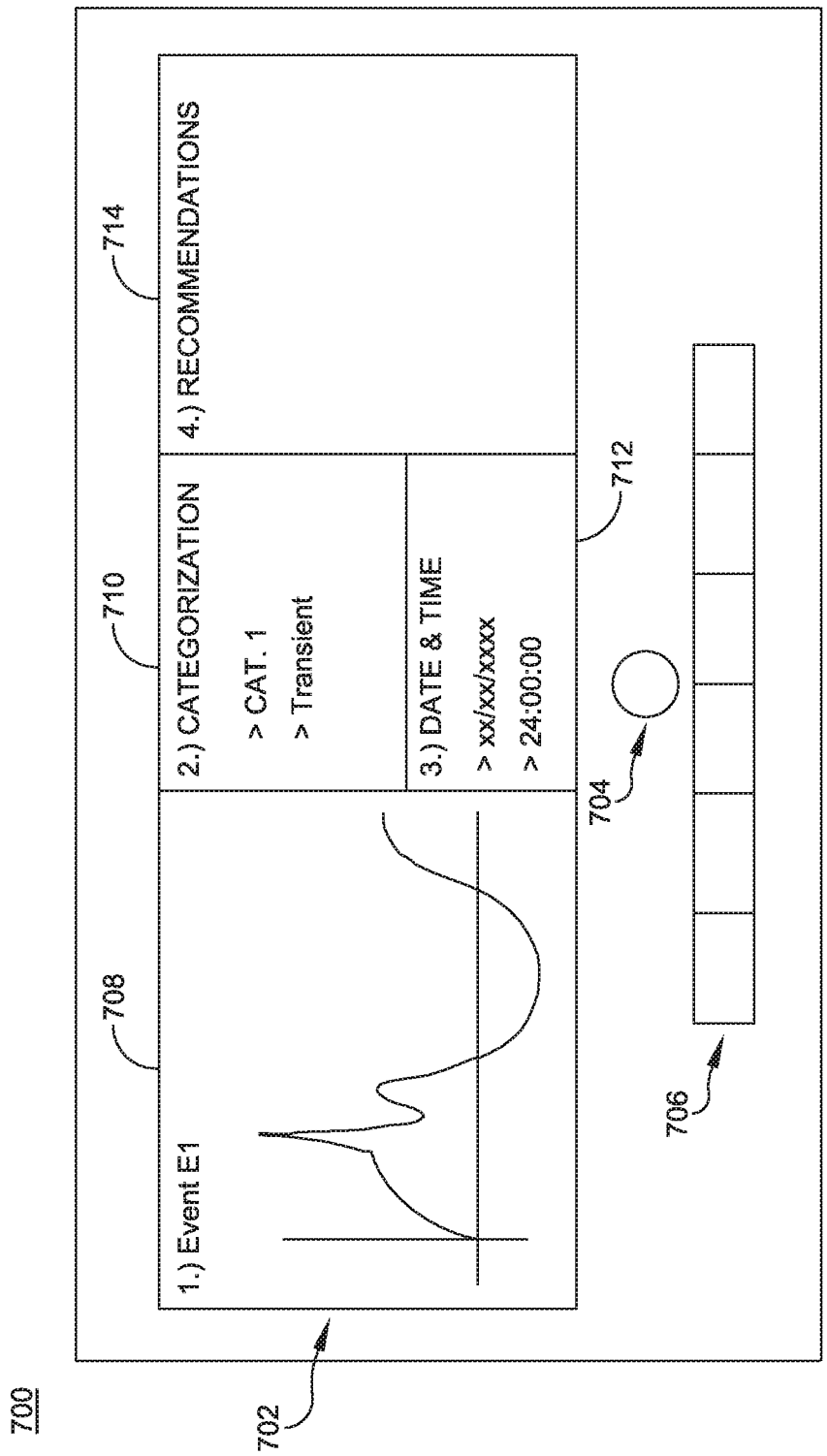
FIG. 7 is a view of an information panel according to one embodiment.

FIG. 7 illustrates a hardware interface 700 that may be coupled to hardware to display event information from a specified IED in accordance with one embodiment. For example, a user can select an IED from one or more IEDs to receive information from via the hardware interface 700. The hardware interface 700 includes a display 702, a status indicator 704, and one or more buttons 706. The display 702 includes waveform capture information 708, categorization information 710, date and time information 712, and recommendation information 714.

The controller 110 is operable to display waveform capture data as a waveform in the waveform capture information 708 section responsive to receiving the waveform capture data. The categorization information 710 includes information about the waveform capture displayed by the waveform capture information 708 section including, for example, a category into which the waveform capture has been placed, a brief description of the category, and so forth. The date and time information 712 section can include a date and time at which the waveform capture was acquired, and the recommendation information 714 section can include recommendations suggesting how to address the disturbance that caused the electrical event. The one or more buttons 706 can be used to navigate through, or interact with, the display 702, and the status indicator 704 may, for example, provide a visual indication when a new waveform capture is generated to notify a user (e.g., an operator) of the waveform capture's existence. The one or more buttons 706 can further include a manual waveform capture button that, upon selection, causes the controller 110 to generate a waveform capture from waveform data provided by a selected IED.

Figure 8:
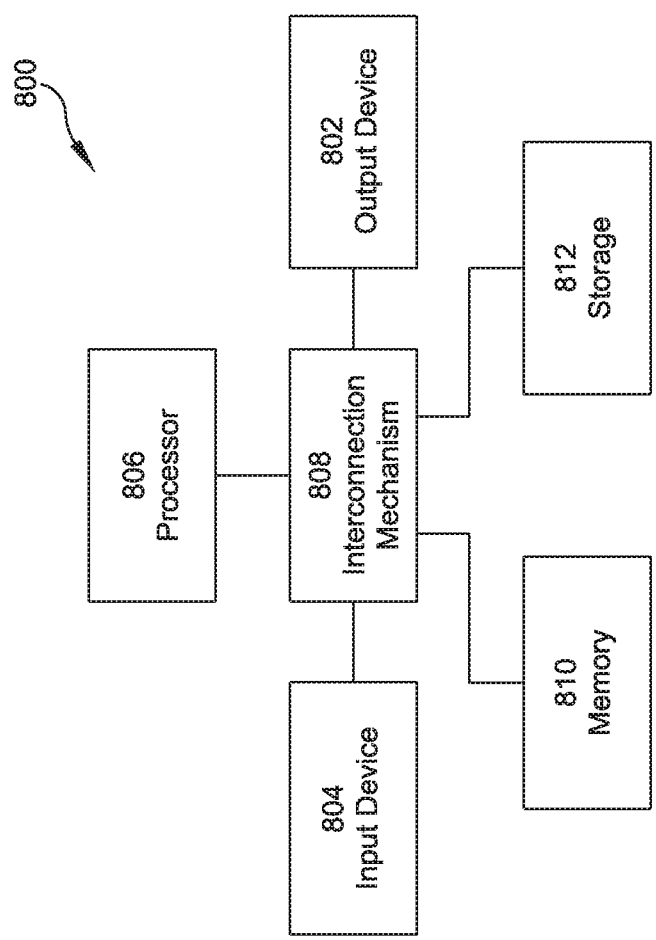
FIG. 8 is a block diagram illustrating a controller architecture according to one embodiment.

FIG. 8 illustrates an example block diagram of computing components forming a system 800 which may be configured to implement one or more aspects disclosed herein. For example, the system 800 may be communicatively coupled to or included within one or more of the IEDs 102.

The system 800 may include for example a general-purpose computing platform such as those based on Intel PENTIUM-type processor, Motorola PowerPC, Sun Ultra-SPARC, Texas Instruments-DSP, Hewlett-Packard PA-RISC processors, or any other type of processor. System 800 may include specially-programmed, special-purpose hardware, for example, an application-specific integrated circuit (ASIC). Various aspects of the present disclosure may be implemented as specialized software executing on the system 800 such as that shown in FIG. 8. The system 800 may include a processor/ASIC 806 connected to one or more memory devices 810, such as a disk drive, memory, flash memory or other device for storing data. Memory 810 may be used for storing programs and data during operation of the system 800. Components of the computer system 800 may be coupled by an interconnection mechanism 808, which may include one or more buses (e.g., between components that are integrated within a same machine) and/or a network (e.g., between components that reside on separate machines). The interconnection mechanism 808 enables communications (e.g., data, instructions) to be exchanged between components of the system 800.

The system 800 also includes one or more input devices 804, which may include for example, a keyboard or a touch screen. The system 800 includes one or more output devices 802, which may include for example a display. In addition, the computer system 800 may contain one or more interfaces (not shown) that may connect the computer system 800 to a communication network, in addition or as an alternative to the interconnection mechanism 808.

The system 800 may include a storage system 812, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 810 that allows for faster access to the information by the processor/ASIC than does the medium. This memory 810 may be a volatile, random access memory such as a dynamic random access memory (DRAM) or static memory (SRAM). It may be located in storage system 812 or in memory system 810. The processor 806 may manipulate the data within the integrated circuit memory 810 and then copy the data to the storage 812 after processing is completed. A variety of mechanisms are known for managing data movement between storage 812 and the integrated circuit memory element 810, and the disclosure is not limited thereto. The disclosure is not limited to a particular memory system 810 or a storage system 812.

The system 800 may include a general-purpose computer platform that is programmable using a high-level computer programming language. The system 800 may be also implemented using specially programmed, special purpose hardware, e.g. an ASIC. The system 800 may include a processor 806, which may be a commercially available processor such as the well-known Pentium class processor available from the Intel Corporation. Many other processors are available. The processor 806 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Furthermore, in some embodiments the controller 110 may be external to the one or more IEDs 102, while in some embodiments the controller 110 may be internal to each of the one or more IEDs 102. Accordingly, the foregoing analysis procedures can be executed by each of the one or more IEDs 102 discussed above, or may be executed partially or exclusively by an entity (e.g., the controller 110) external to the one or more IEDs 102.

FIG. 9 is a process flow diagram 900 illustrating another example method to automatically analyze a waveform capture in accordance with embodiments of this disclosure. The method may be implemented, for example, on at least one controller (e.g., 110, shown in FIG. 1) coupled to a plurality of IEDs (e.g., 102, shown in FIG. 1) in a power system, on at least one of the plurality of IEDs (e.g., on at least one controller in the at least one of the plurality of IEDs), and/or remote from the at least one controller and/or the plurality of IEDs. For example, the method may be implemented in at least one of: an IED, cloud-based system, on-site/edge software, a gateway, or another head-end system. Similar to the method illustrated by flow diagram 200, the method illustrated by flow diagram 900 may be performed in a different order than shown, and some acts may be omitted.

As illustrated in FIG. 9, the method begins at block 902. At block 904, electrical signals are measured in the power system using a plurality of IEDs in the power system. For example, the plurality of IEDs, which may be coupled to one or more loads/equipment/apparatuses in some embodiments, may measure the electrical signals at respective metering points in the power system. In embodiments in which the plurality of IEDs are coupled to one or more loads/equipment/apparatuses, for example, the measured electrical signals may be associated with the loads/equipment/apparatuses to which the plurality of IEDs are coupled. It is understood that the electrical signals may be collected from at least one or more loads and/or non-loads such as control system(s) and sensor device(s) (e.g., for I/O status information).

In accordance with embodiments of this disclosure, the measured electrical signals include at least one of a voltage signal, a current signal, input/output (I/O) data, and a derived or extracted value. Examples of each of these example types of signals/data are noted in the Summary Section of this disclosure.

At block 906, at least one electrical event is detected in the power system based on the electrical signals measured using the plurality of IEDs. As previously discussed, there are many different types of electrical events that may be detected using the systems and methods disclosed herein. For example, the at least one detected electrical event may correspond to or include a power quality event, such as those illustrated in FIG. 4. It is understood there are types of power quality events and there are certain characteristics of these types of power quality events. It is also understood that the at least one electrical event detected at block 906 may include other types of electrical events besides power quality events in some embodiments. As an example amongst others, some signals may be created and transmitted as an electrical event on the power system, either by the utility, or by the facility. This may be used to indicate a time information, a rate information, or any other pre-determined usage. Such an electrical signal will not trigger or be classified as a power quality event. But it may still be captured and analyzed as described herein. Another type of event is the user or system "triggered event" waveform capture. This may be used to capture different samples of "normal" captures of the power system. This will be helpful to understand if any of the "normal running conditions" are close to any Power Quality threshold. In this case this may impact the relevancy analysis and be a weighting factor.

In accordance with some embodiments of this disclosure, at block 906 (or another block in the method illustrated by FIG. 9) IEDs that are capable of detecting the at least one electrical event are identified. In some embodiments, it may be determined if any IEDs of the IEDs identified as capable of detecting the at least one electrical event did not detect the at least one electrical event. In response to identifying IEDs that are capable of but did not detect the at least one electrical event, at least one reason the identified IEDs did not detect the at least one electrical event may be established/determined. The at least one established/determined reason may indicate or include, for example, at least one factor explaining why the at least one electrical event was not detected by the identified IEDs. For example, the at least one established/determined reason may indicate a problem (e.g., improper configuration setting(s), fault(s)) with the identified IEDs. One or more actions may be taken in response to the problem. The actions may include, for example, sending a notification to a member of the services team indicating the problem (e.g., fault(s) with the IED(s)) and/or automatically addressing the problem (e.g., reconfiguring the IED(s), adjusting one or more settings associated with the IED(s), etc.).

At block 908, in response to detecting the at least one electrical event at block 906, and/or in response to receiving a trigger signal, for example, as discussed in further detail below, at least two waveform captures may be generated from the plurality of IEDs. In accordance with some embodiments of this disclosure, similar to the method illustrated by the flow diagram 200, the occurrence of the at least one electrical event may trigger the plurality of IEDs to automatically detect and capture corresponding waveform data produced by the at least one electrical event detected at block 906, and generate at least two waveform captures (e.g., from sampled data) that includes the at least one electrical event. The at least two waveform captures may be the same as or similar to the example waveform capture 300 shown in FIG. 3, for example. As previously discussed, the waveform capture 300 includes an electrical event 302 characterized by fluctuations in three-phase voltage signals 304a, 304b and 304c. It is understood that many different types of electrical events may be detected and captured by IEDs (i.e., as waveform captures) in accordance with embodiments of this disclosure.

It is also understood that many different types of data other than waveform capture data may be generated in response to detecting the at least one electrical event in accordance with embodiments of this disclosure. For example, at least one of the plurality of IEDs and/or other systems and/or devices associated with or external to the power system may generate non-waveform capture data. The non-waveform capture data may include, for example, at least one of input/output (I/O) data (e.g., a status change on the motor I/O stating that motor was started, status indicator was changed to "ON") and event data (e.g., a "voltage sag alarm on phase AB") and measurement logged data (e.g., the voltage magnitude of phase AB is logged) captured in response to detecting the at least one electrical event. Additionally, the non-waveform capture data may include classifications, metadata, logged data, reference to Modbus registries or values, event labels or tags, and other relevant information that is not the waveform capture data. This supplemental information can be used, for example, to help with classification and determining potential relevancy of waveform captures from the plurality of IEDs, as will be further appreciated from discussions below. It is understood that this supplemental information can be used for one or more waveform captures of the at least two waveform captures from the plurality of IEDs.

It is understood that waveform captures, such as the at least two waveform captures, and non-waveform data captures, such as the above-discussed non-waveform capture data, may be triggered (i.e., initiated) through/by a number of means. They may be triggered, for example, by an electrical event such as a voltage sag, voltage transient, current swell, frequency deviation, excessive total harmonic distortion (THD), voltage and/or current imbalance, undervoltage and/or overvoltage condition, voltage fluctuation, and so forth. They may also be triggered in response to an internal prompt (i.e., via IED firmware) and/or an external prompt (i.e., independent of the IED, such as by a Power SCADA system for example). The internal prompts may originate from an IED's algorithms or firmware, which may detect one or more conditions that have been met. These internally-sourced conditions may arise from (or be derived from) the direct input of electrical signals (e.g., measured signals and/or derived data), internal temporal mechanisms (e.g., timers, clocks, etc.), manually (e.g., initiated directly at the IED human machine interface (HMI) and/or remotely), internal control signal(s)/system(s), internal algorithms (e.g., metering, custom applications, etc.) and/or some combination thereof. Externally-sourced conditions may arise from (or be derived from) the same type sources as internally-sourced conditions; however, their origin is external to the IED and/or its direct inputs. For example, externally-sourced conditions may initiate/trigger a waveform capture(s) due to external electrical signal(s), external temporal mechanism(s), external manual means (local and/or remote), external control signal(s)/system(s), external algorithm(s), or some combination thereof. Moreover, internally-sourced and externally-sourced conditions may be used independently or in concert with triggered waveform captures. Temporal mechanisms may incorporate at least one of a periodic, pseudo-random, and/or indiscriminate/random technique(s)/method(s)/approach(es) to determine whether a condition (e.g., energy-related condition, or non-energy related condition) is met to trigger a waveform capture and/or to determine what contextual conditions are normal when no trigger of a waveform capture is met.

In accordance with some embodiments of this disclosure, in addition to the waveform captures and non-waveform data captures being triggered automatically, semi-automatically, periodically, pseudo-randomly, and/or indiscriminately/randomly, for example, as discussed above, the waveform captures and non-waveform data captures may be triggered manually (e.g., through a button press, voice command, remotely, etc.) and/or through or by any other means as understood by of ordinary skill in the art. It is understood that triggers may generally be referred to as energy-related triggers or non-energy related triggers. The energy-related triggers may be initiated, for example, in response to one or more energy-related events or conditions (e.g., electrical events or conditions, as discussed above). Additionally, the non-energy related triggers may be initiated in response to one or more non-energy related events or conditions (i.e., events or conditions besides energy-related events or conditions).

In one embodiment, a non-energy related trigger includes a trigger to generate at least two waveform captures on the plurality of IEDs and/or a trigger of non-energy related events. In one embodiment, the non-energy related trigger may be received and/or detected directly by at least one of the plurality of IEDs. In another embodiment, the non-energy related trigger may be received and/or detected by at least one other system and/or device besides the plurality of IEDs, and subsequently communicated by the at least one other system and/or device to the plurality of IEDs. For example, in embodiments in which the non-energy related trigger includes a trigger to generate at least two waveform captures on the plurality of IEDs, the non-energy related trigger may be received and/or detected by the at least one other system and/or device, and subsequently be communicated to the plurality of IEDs. The plurality of IEDs may then, in turn, generate the at least two waveform captures in response to the communication from the at least one other system and/or device. It is understood that the non-energy related trigger may be initiated and detected in a variety of manners. For example, the non-energy related trigger may be initiated by a button press, a voice command, remotely, etc., and subsequently detected by at least one system and/or device capable of interpreting the button press, voice command, etc.

It is also understood that functionality(s) associated with trigger(s), and actions performed in response to trigger(s), may take a variety of forms. For example, a trigger may be forced or initiated to analyze steady-state conditions of the power system and potentially identify issues/concerns/problems that do not necessarily meet the level of an electrical event. Additionally, a trigger may be initiated to perform a system-wide waveform capture of all the three-phase voltages and currents at all capable IEDs within my system. Spectral analysis (e.g., Fourier analysis, stationary spectral density analysis, nonstationarity and wavelets analysis) can then be performed, for example, on all the voltage and current waveforms to understand how the harmonic power flows are propagating throughout the power system.

At block 910, the at least two waveform captures discussed above are analyzed on at least one controller coupled to the plurality of IEDs to identify at least one associated characteristic/trait from the at least two waveform captures. The at least one associated characteristic/trait may include, for example, at least one of similarity(ies) and dissimilarity(ies) associated with, or derived from, the at least two waveform captures. In some instances, the similarity(ies) and dissimilarity(ies) may additionally be associated with, or derived from, non-waveform data (e.g., logged data, status changes, etc.). The non-waveform data may be received, for example, from at least one of the plurality of IEDs and/or other systems and/or devices (e.g., a control system and/or device, sensor system and/or device, etc.) associated with the power system.

The similarity(ies) and dissimilarity(ies) may include, for example, at least one of: increases, decreases, differences, discrepancies, deviations, attenuations, propagations, alterations, changes in energy-related parameters associated with the at least two waveform captures. In accordance with some embodiments of this disclosure, the similarity(ies) and dissimilarity(ies) are associated with shape of the at least two waveform captures. The shape of the at least two waveform captures may include, for example, magnitude, duration, harmonic distortion, etc. Additionally, in accordance with some embodiments of this disclosure the dissimilarity(ies) include at least one of: incongruencies (e.g., a notch into or out of the signal present on only one of all the waveforms/IEDs, but not on any of the other captured waveforms/IEDs), variations (e.g., in magnitude or presence, such as a decrease in high frequency components as the IEDs are further away from the source of the event) and distinctions (e.g., on some waveforms/IEDs we may have a notch into the curve vs. on other IEDs one may have a notch out of the curve).

In accordance with some embodiments of this disclosure, the at least two waveform captures are analyzed based on at least one of location(s), type(s), load(s), load type(s), process(es), application(s), user input(s), metadata, functionality(ies) of the plurality of IEDs capturing the at least two waveform captures, and factors calculated or derived from other analysis or observations. The factors calculated or derived from other analysis or observations may include, for example, at least one of: impact(s), severity(s), distance(s), impedance change(s), grouping(s), electrical event criticality(ies), energy-related parameter(s), derived characteristic(s), setting(s), configuration(s), event duration(s), solution(s)/mitigation(s), cost(s), stimulate(s), induce(s), effect(s), recovery time duration(s), significance(es), loss(es), attenuation(s). With respect to analyzing the at least two waveform captures based on location(s), in accordance with some embodiments of this disclosure the plurality of IEDs responsible for capturing the at least two waveform captures may be grouped or clustered according to location(s), and the at least one associated characteristic/trait may be identified from the at least two waveform captures based on the grouping or clustering. In accordance with embodiments of this disclosure in which the location(s) of at least one electrical event are unknown, a most probable location may be identified, for example, using propagation rules and impedance changes and/or the measured electrical signals and/or the plurality of waveform captures associated with the plurality of IEDs responsible measuring the electrical signals and/or generating the plurality of waveform captures.

In accordance with some embodiments of this disclosure, at least one of the plurality of IEDs influences the analysis more heavily than another of the plurality of IEDs. For example, a main meter or IED in the power system may influence the analysis more heavily than an IED further downstream (e.g., further away from the source of the at least one electrical event) in the power system. Additionally, a high-end meter or IED with more functionality or capabilities than a low-end IED may influence the analysis more heavily than the lower-end IED. In accordance with some embodiments of this disclosure, at least one of the at least two waveform captures influences the analysis of the at least two waveform captures more heavily than another one of the at least two waveform captures. An amount/level/degree of the influence on the analysis of the at least two waveform captures may be based on a number of factors. For example, the amount/level of the analysis of the at least two waveform captures may be based on at least one of location(s), type(s), load(s), process(es), application(s), user input(s), metadata, functionality(ies) of the plurality of IEDs capturing the at least two waveform captures, and factors calculated or derived from other analysis or observations. The factors calculated or derived from other analysis or observations may include, for example, at least one of: magnitude, phase angle, impedance, frequency component, impact, phase, shape, duration, time of occurrence, electrical parameter, change, attribute(s) of the at least two waveform captures from the plurality of IEDs.

In accordance with some embodiments of this disclosure, the at least one controller on which the at least two waveform captures are analyzed corresponds to or includes at least one controller associated with at least one of the plurality of IEDs, at least one controller associated with a system and/or device (e.g., power monitoring system or control system) coupled to the plurality of IEDs, and at least one controller associated with an IED, gateway, a cloud-based system, on-site software/edge, and/or a remote server.

At block 912, the at least one associated characteristic/trait from the at least two waveform captures is classified based on at least one of the analysis of the at least two waveform captures and the at least one associated characteristic/trait. The classification may be a complete classification, or a partial classification, based on or derived from the classification steps discussed in connection with figures above, for example. In accordance with some embodiments of this disclosures, the classification of the at least one associated characteristic/trait from the at least two waveform captures includes a power quality event classification, an impact classification, and/or other energy-related classifications (e.g., a classification as a "non-event/normal operation", or a user defined classification). Examples of user defined classifications include, for example, classification of non-linear loads of a particular type, or classifications of specific branches of a single line diagram.

With respect to power quality event classifications, the at least one associated characteristic/trait from the at least two waveform captures may be classified into at least one of a plurality of power quality event categories, for example. Additionally, the at least one associated characteristic/trait from the at least two waveform captures may be classified as impactful or non-impactful (e.g., no impacted detected/determined) to the power system. In accordance with some embodiments of this disclosure, the impact classification is based on an evaluation of global impact(s) of detected electrical event(s) associated with the at least two waveform captures on the power system. Additionally, in accordance with some embodiments of this disclosure, the impact classification includes identifying impact zones in the power system. The identified impact zones may correspond to or include, for example, a physical location such as a specific building of a campus, or a specific part and/or process within a manufacturing facility. The identified impact zones may be represented, for example, in terms of decreasing impact with colors such as in a heatmap.

At block 914, at least one potential relevancy of at least one of the at least one associated characteristic/trait and the classification(s) of the at least one associated characteristic/trait to the power system is determined. In accordance with some embodiments of this disclosure, the at least one potential relevancy includes relevancy based on at least one of location, severity, event duration, solution/mitigation, cost, impact, stimulate, induce, effect, change, recovery time duration, significance, loss, and attenuation that influence the electrical system, for example. It is understood that many other types of potential relevancies are possible.

At block 916, one or more actions may be taken based on the at least one potential relevancy determined at block 914. In one embodiment, the one or more actions taken include providing an indication of the determined at least one potential relevancy via at least one of: a report, a text, an email, audibly, visually, and an interface of a screen/display. Additionally, in one embodiment the one or more actions taken include adjusting one or more parameters associated with at least one electrical component, system and/or device in the power system based on the determined at least one potential relevancy.

In accordance with some embodiments of this disclosure, actions (e.g., local actions) may be taken based on the at least one determined potential relevancy using the grouping or clustering (e.g., locations) of the plurality of IEDs responsible for capturing the at least two waveform captures. As an example, a maintenance action may be triggered based on a group of loads identified and selected based on the detected event type and an impact analysis (e.g., this may show an increase of sensitivity to voltage sags, which may be defined as a relevancy criteria for this location).

At block 918, the method ends. In some embodiments, subsequent to block 918, the method may repeat or be initiated again in response to user input and/or a control signal, for example. The control signal may be generated, for example, in response to an updated status and/or condition with respect to a load, loads, process, processes, etc. associated with the power system.

It is understood that method illustrated in FIG. 9 may include one or more additional blocks or steps in some embodiments. For example, in some embodiments the method may include developing at least one level/degree of confidence based on at least one of the analysis of the at least two waveform captures at block 910, the classification(s) of the at least one associated characteristic/trait at block 912, and the determined at least one potential relevancy at block 914, as discussed further in connection with FIG. 10.

Referring now to FIG. 10, a process flow diagram 1000 is shown to illustrate an example method for developing at least one level/degree of confidence. As illustrated in FIG. 10, the method begins at block 1002. At block 1004, quantitative data is received, for example, at an input of at least one controller (e.g., 110, shown in FIG. 1) coupled to a plurality of IEDs (e.g., 102, shown in FIG. 1) in a power system. In accordance with some embodiments of the disclosure, the quantitative data includes the data from and/or derived from the at least two waveform captures generated at block 908 of the method illustrated in FIG. 9. As discussed above in connection with FIG. 9, the at least two waveforms captures are generated by the plurality of IEDs.

In some embodiments, the quantitative data further includes non-waveform capture data. As discussed above in connection with FIG. 9, the non-waveform capture data may be generated by the plurality of IEDs and/or other systems and/or devices (e.g., sensor devices) associated with the power system besides the plurality of IEDs. The non-waveform capture data may, for example, supplement the data from and/or derived from the at least two waveform captures. Or in another embodiment, this quantitative data may come as an indicator from another system (such as detected defaults rate in a related process).

It is understood that the quantitative data may be generated and/or received based on the parameter(s) for which the at least one level/degree of confidence is to be developed. For example, in embodiments in which at least one level of confidence is to be developed for the analysis of the at least two waveform captures performed at block 910, the quantitative data should include quantitative data relevant to developing this particular at least one level/degree of confidence. At block 1006, qualitative data is received, for example, at an input of the at least one controller in the power system. In accordance with some embodiments of the disclosure, the qualitative data (indicative of the quality of the data being received/generated) includes the data from and/or derived from the at least two waveform captures generated at block 908 of the method illustrated in FIG. 9. For example, it may be determined from the at least two waveform captures if there are any IEDs of the plurality of IEDs that should have but did not detect the at least one electrical event (and, therefore, did not generate a waveform capture).

In some embodiments, the qualitative data may further include non-waveform capture data. For example, status information may be received and used to determine if any of the IEDs in the power system are off (e.g., due to a component failure in the IEDs).

It is understood that the qualitative data may be generated and/or received based on the parameter(s) for which the at least one level/degree of confidence is to be developed. For example, referring back to the example noted above in which at least one level/degree of confidence is to be developed for the analysis of the at least two waveform captures performed at block 910, the qualitative data should include qualitative data relevant to developing this particular at least one level/degree of confidence.

At block 1008, at least one level/degree of confidence is generated or updated. In accordance with some embodiments of this disclosure, the at least one level/degree of confidence is developed based, at least in part, on the coherence and completness of indications from the plurality of IEDs. For example, the at least one level/degree of confidence may be developed based, at least in part, on an analysis of the number and/or locations of IEDs of the plurality of IEDs that are capable of detecting and did detect the at least one electrical event at block 906 of the method illustrated in FIG. 9. Additionally, the at least one level/degree of confidence may be developed based, at least in part, on an analysis of similarities between data associated with the measured electrical signals and/or the plurality of waveform captures generated by IEDs of the plurality of IEDs that are capable of detecting and did detect the at least one electrical event.

In accordance with some embodiments of this disclosure, the at least one level/degree of confidence may be reduced (or be lower than anticipated) in response to there being at least one IED of the plurality of IEDs that is capable of detecting and did not detect the at least one electrical event (i.e., should have detected the at least one electrical event because of the nature of the at least one electrical event and capabilities of the at least one IED). For example, at least one reason the at least one IED did not detect the at least one electrical event may be determined, and the at least one level/degree of confidence may be adjusted or recalculated based on the determined at least one reason (e.g., the device being improperly configured or faulty). In accordance with some embodiments of this disclosure, the at least one level/degree of confidence may additionally or alternatively be reduced (or lower than anticipated) in response at least one of the IEDs providing conflicting information and/or assessment(s) from at least another one of the IEDs.

At block 1008, the at least one level/degree of confidence may also be generated or updated in response to user input. The user input may include, for example, a user validation of the analysis of the at least two waveform captures at block 910, the classification(s) of the at least one associated characteristic/trait at block 912, and the determined at least one potential relevancy at block 914. The user validation may be received, for example, from an end-user and/or system operator via one or more input devices (e.g., touch screen, microphone, keyboard). The input devices may be provided on or be coupled to one or more user devices (e.g., tablet, portable computer, etc.) that are in turn coupled to the system(s) and/or device(s) on which the method illustrated by FIG. 10 is implemented.

It is understood that the at least one level/degree of confidence may take a variety of forms. For example, in accordance with some embodiments of this disclosure, the at least one level/degree of confidence may be indicated by at least one of a confidence factor, color, certainty, probability, graphical representation, light, number, percentage, sound, vibration, rank, warning/alarm, and trigger for action. For example, in embodiments in which the at least one level/degree of confidence is based on the analysis of the at least two waveform captures to identify at least one associated characteristic/trait from the at least two waveform captures, a confidence factor indicative of the at least one level/degree of confidence may be generated. The confidence factor may be a confidence measure of correct identification of the at least one associated characteristic/trait. Additionally, or alternatively, a color (e.g., red, yellow, green), number(s) (e.g., 10, 50, 90), percentage(s) (e.g., 10%, 50%, 90%), visual, graphic(s), sound(s) (e.g., beeping sound), rank (e.g., 1, 2, 3), warning(s)/alarm(s), and trigger(s) for action (e.g., adjusting parameter(s) and/or state(s) of power system equipment) indicative of correct identification of the at least one associated characteristic/trait may be generated, for example. In accordance with some embodiments of this disclosure, the trigger for action may be related to the one or more actions taken based on the determined at least one potential relevancy of at least one of the at least one associated characteristic/trait and the classification(s) of the at least one associated characteristic/trait to the power system at block 916 of the method illustrated in FIG. 9. The trigger for action may be initiated, for example, in response to the at least one level/degree of confidence falling below one or more prescribed thresholds. An action may then be either triggered, or disabled or not taken (e.g., if the confidence is low, no alarm may be sent to the user). The prescribed thresholds may include at least one static threshold, and/or at least one dynamic threshold. The at least one dynamic threshold may change, for example, in response to changes in the power system. The changes in the power system may be detected, for example, from the electrical signals captured by the plurality of IEDs in the power system. In one example implementation, the changes are detected after manually training/teaching a system to identify the changes. For example, the specific equipment (or processes) operating at a given time may be described to allow the system to learn (i.e., a form of machine learning).

It is understood that users may configure, and the system may learn, what actions are to be taken in response to certain conditions. For example, users may configure when notifications are to be sent in response to the at least one level/degree of confidence meeting certain conditions (e.g., exceeding or falling below the above-discussed thresholds). Additionally, users may configure the types of notifications (e.g., emails, texts, etc.) to be sent in response to the at least one level/degree of confidence meeting the certain conditions. Subsequent to block 1008, the method may end in some embodiments. In other embodiments, the method may repeat again after block 1008 and return to block 1004, for example, where further quantitative data may be received (e.g., in response to additional waveform captures being generated by the plurality of IEDs). The at least one level/degree of confidence previously generated at block 1008 may then be evaluated and updated, for example, in response to the newly received quantitative and/or qualitative data.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A method for analyzing waveform capture data in a power system, the method comprising:
   measuring electrical signals in the power system using a plurality of intelligent electronic devices (IEDs), the plurality of IEDs being coupled to the power system;
   detecting at least one electrical event in the power system based on the measured electrical signals from the plurality of IEDs;
   in response to detecting the at least one electrical event, generating at least two waveform captures on the plurality of IEDs as a result of the at least one electrical event, the at least two waveform captures including a first waveform capture and a second waveform capture;
   analyzing the at least two waveform captures on at least one controller coupled to the plurality of IEDs to identify at least one associated characteristic/trait from the at least two waveform captures, the at least one associated characteristic/trait including at least one similarity between an energy-related parameter as indicated by the first waveform capture and the energy-related parameter as indicated by the second waveform capture, wherein analyzing the at least two waveform captures includes analyzing the first waveform capture generated by a first IED and the second waveform capture generated by a second IED, and wherein the analysis weights the first waveform capture generated by the first IED more heavily than the second waveform capture generated by the second IED;
   classifying the at least one associated characteristic/trait from the at least two waveform captures based on the at least one similarity between the energy-related parameter as indicated by the first waveform capture and the energy-related parameter as indicated by the second waveform capture, wherein classifying the at least one associated characteristic/trait includes identifying a cause of the at least one electrical event in the power system based on the at least one similarity between the energy-related parameter as indicated by the first waveform capture and the energy-related parameter as indicated by the second waveform capture, and wherein the first waveform capture and the second waveform capture each capture at least a portion of the at least one electrical event;

determining at least one potential relevancy of at least one of the at least one associated characteristic/trait and the classification(s) of the at least one associated characteristic/trait to the power system;

developing at least one level and/or degree of confidence based on at least one of the analysis of the at least two waveform captures, the classification(s) of the at least one associated characteristic/trait, and the determined at least one potential relevancy;

detecting a change in the power system caused by the electrical event based on pre-training at least one controller of the power system using a plurality of prior electrical events causing a plurality of changes in the power system;

determining a dynamic confidence threshold in response to the change in the power system; and automatically initiating corrective or mitigative steps using the at least one controller to fix the cause of the at least one electrical event in response to the at least one level and/or degree of confidence exceeding the dynamic confidence threshold, wherein the corrective or mitigative steps include adjusting one or more parameters associated with at least one electrical component, system, and/or device in the power system based on the determined at least one potential relevancy.

2. The method of claim 1, further comprising: identifying IEDs of the plurality of IEDs that did not detect the at least one electrical event.

3. The method of claim 2, further comprising: in response to identifying IEDs that did not detect the at least one electrical event, establishing at least one reason the identified IEDs did not detect the at least one electrical event.

4. The method of claim 1, further comprising: detecting at least one other event in the power system besides the at least one electrical event.

5. The method of claim 4, wherein the at least one other event includes at least one non-energy related trigger, the at least one non-energy related trigger initiated at least one of manually, periodically, pseudo-randomly, and indiscriminately.

6. The method of claim 5, wherein the at least one non-energy related trigger includes a trigger to generate the at least two waveform captures on the plurality of IEDs.

7. The method of claim 1, wherein at least one of the plurality of IEDs and/or other systems and/or devices further generates non-waveform capture data.

8. The method of claim 7, wherein the non-waveform capture data is used in the analysis of the at least two waveform captures, the classification(s) of the at least one associated characteristic/trait, and the determined at least one potential relevancy.

9. The method of claim 1, wherein the at least two waveform captures are at least one of analyzed, classified and used to determine the at least one potential relevancy based on at least one of: location(s), type(s), load(s), load type(s), process(es), application(s), user input(s), metadata, functionality (ies) of the plurality of IEDs capturing the at least two waveform captures, and factors calculated or derived from other analysis or observations.

10. The method of claim 9, wherein the factors calculated or derived from other analysis or observations include at least one of: similarity(s), incongruency(s), variation(s), shape(s), severity(s), impact(s), distance(s), grouping(s), electrical event criticality (ies), energy- related parameter(s), derived characteristic(s), setting(s), configuration(s), event duration(s), solution(s)/mitigation(s), cost(s), stimulate(s), induce(s), effect(s), level/degree of change(s), recovery time duration(s), significance(es), loss(es), attenuation(s), process signal(s), load signal(s), status change(s), other change(s), attribute(s).

11. The method of claim 1, wherein at least one of the at least two waveform captures influences at least one of: the analysis of the at least two waveform captures, the classification(s) of the at least one associated characteristic/trait, and the determination(s) of the at least one potential relevancy, more heavily than another one of the at least two waveform captures.

12. The method of claim 11, wherein an amount/level/degree of the influence on the analysis of the at least two waveform captures is based on at least one of location(s), type(s), load(s), process(es), application(s), user input(s), metadata, functionality (ies) of the plurality of IEDs capturing the at least two waveform captures, and factors calculated or derived from other analysis or observations.

13. The method of claim 12, wherein the factors calculated or derived from other analysis or observations include at least one of: magnitude, phase angle, frequency component, impact, phase, shape, duration, time of occurrence, electrical parameter, change, attribute(s) of the at least two waveform captures from the plurality of IEDs.

14. The method of claim 1, wherein the at least one associated characteristic/trait identified from the at least two waveform captures includes at least one of similarity (ies) and dissimilarity (ies) associated with, or derived from, the at least two waveform captures.

15. The method of claim 1, wherein the measured electrical signals include at least one of a voltage signal, a current signal, input/output (I/O) data, and a derived or extracted value.

16. The method of claim 1, wherein the at least one controller on which the at least two waveform captures are analyzed includes at least one controller associated with at least one of the plurality of IEDs, a control system or device coupled to the plurality of IEDs, a gateway, a cloud-based system, on-site software/edge, and/or a remote server.

17. The method of claim 1, wherein the corrective or mitigative steps further include providing an indication of the determined at least one potential relevancy via at least one of: a report, a text, an email, audibly, and an interface of a screen/display.

18. The method of claim 1, wherein identifying the cause of the at least one electrical event includes determining, based on the at least one similarity between the energy-related parameter as indicated by the first waveform capture generated by the first IED and the energy-related parameter as indicated by the second waveform capture generated by the second IED, a power-quality-event classification of the at least one electrical event.

19. The method of claim 1, wherein identifying the cause of the at least one electrical event includes determining, based on the at least one similarity between the energy-related parameter as indicated by the first waveform capture generated by the first IED and the energy-related parameter as indicated by the second waveform capture generated by the second IED, a type of a non-linear load on the power system.

20. A system for analyzing waveform capture data in a power system, comprising:
at least one controller; and
at least one memory device coupled to the at least one controller, the at least one controller and the at least one memory device configured to:
receive at least two waveform captures from a plurality of intelligent electronic devices (IEDs) coupled to the power system, the at least two waveform captures generated by the plurality of IEDs as a result of at least one electrical event detected in the power system by the plurality of IEDs, the at least two waveform captures including a first waveform capture and a second waveform capture;
analyze the at least two waveform captures on the at least one controller to identify at least one associated characteristic/trait from the at least two waveform captures, the at least one associated characteristic/trait including at least one similarity between an energy-related parameter as indicated by the first waveform capture and the energy-related parameter as indicated by the second waveform capture, wherein analyzing the at least two waveform captures includes analyzing the first waveform capture generated by a first IED and the second waveform capture generated by a second IED, and wherein the analysis weights the first waveform capture generated by the first IED more heavily than the second waveform capture generated by the second IED;
classify the at least one associated characteristic/trait from the at least two waveform captures based on the at least one similarity between the energy-related parameter as indicated by the first waveform capture and the energy-related parameter as indicated by the second waveform capture, wherein classifying the at least one associated characteristic/trait includes identifying a cause of the at least one electrical event in the power system based on the at least one similarity between the energy-related parameter as indicated by the first waveform capture and the energy-related parameter as indicated by the second waveform capture, and wherein the first waveform capture and the second waveform capture each capture at least a portion of the at least one electrical event;
determine at least one potential relevancy of at least one of the at least one associated characteristic/trait and the classification(s) of the at least one associated characteristic/trait to the power system;
develop at least one level and/or degree of confidence based on at least one of the analysis of the at least two waveform captures, the classification(s) of the at least one associated characteristic/trait, and the determined at least one potential relevancy;
detect a change in the power system caused by the electrical event based on pre-training the at least one controller using a plurality of prior electrical events causing a plurality of changes in the power system;
determine a dynamic confidence threshold in response to the change in the power system; and
automatically initiate corrective or mitigative steps to fix the cause of the at least one electrical event in response to the at least one level and/or degree of confidence exceeding the dynamic confidence threshold,
wherein the corrective or mitigative steps include adjusting one or more parameters associated with at least one electrical component, system, and/or device in the power system based on the determined at least one potential relevancy.

21. The system of claim 20, wherein the plurality of IEDs and/or the system are further configured to detect at least one other event in the power system besides the at least one electrical event.

22. The system of claim 21, wherein the at least one other event includes at least one non-energy related trigger, the at least one non-energy related trigger initiated at least one of manually, periodically, pseudo-randomly, and indiscriminately.

23. The system of claim 22, wherein the at least one non-energy related trigger includes a trigger to generate the at least two waveform captures on the plurality of IEDs.

24. The system of claim 20, wherein at least one of the plurality of IEDs and/or other systems and/or devices further generates non-waveform capture data.

25. The system of claim 24, wherein the non-waveform capture data is used in the analysis of the at least two waveform captures, the classification(s) of the at least one associated characteristic/trait, and the determination(s) of the at least one potential relevancy.

26. The system of claim 20, wherein the at least two waveform captures are at least one of analyzed, classified and used to determine the at least one potential relevancy based on at least one of: location(s), type(s), impact(s), load(s), load type(s), process(es), application(s), user input(s), metadata, functionality (ies) of the plurality of IEDs capturing the at least two waveform captures, and factors calculated or derived from other analysis or observations.

27. The system of claim 26, wherein the factors calculated or derived from other analysis or observations include at least one of: severity(s), distance(s), grouping(s), shape(s), magnitude(s), electrical event criticality (ies), energy-related parameter(s), derived characteristic(s), setting(s), configuration(s), event duration(s), solution(s)/mitigation(s), cost(s), stimulate(s), induce(s), effect(s), recovery time duration(s), significance(es), loss(es), attenuation(s).

* * * * *